(12) United States Patent
Ma et al.

(10) Patent No.: US 11,096,281 B2
(45) Date of Patent: Aug. 17, 2021

(54) POWER DELIVERY SYSTEM

(71) Applicant: Dell Products L.P., Round Rock, TX (US)

(72) Inventors: Xin Zhi Ma, Shanghai (CN); Nan Wang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/902,014

(22) Filed: Jun. 15, 2020

(65) Prior Publication Data

US 2021/0219427 A1 Jul. 15, 2021

(30) Foreign Application Priority Data

Jan. 14, 2020 (CN) .......................... 202010037781.7

(51) Int. Cl.
| | |
|---|---|
| H05K 1/14 | (2006.01) |
| H05K 1/02 | (2006.01) |
| H05K 1/11 | (2006.01) |
| H05K 1/05 | (2006.01) |

(52) U.S. Cl.
CPC ........... *H05K 1/142* (2013.01); *H05K 1/0225* (2013.01); *H05K 1/05* (2013.01); *H05K 1/113* (2013.01); *H05K 1/141* (2013.01); *H05K 1/144* (2013.01); *H05K 1/145* (2013.01)

(58) Field of Classification Search
CPC .......... H05K 1/14; H05K 1/141; H05K 1/142; H05K 1/144; H05K 1/145; H05K 1/111
See application file for complete search history.

(56) References Cited

U.S. PATENT DOCUMENTS

| | | | | |
|---|---|---|---|---|
| 2001/0026434 A1* | 10/2001 | Loddenkoetter | ...... | H01L 25/072 361/200 |
| 2011/0199265 A1* | 8/2011 | Lin | ........................ | H01Q 5/378 343/700 MS |
| 2013/0105961 A1* | 5/2013 | Jones | ...................... | H01L 23/24 257/691 |
| 2016/0014897 A1* | 1/2016 | Strobel-Maier | ........ | H05K 1/142 361/728 |
| 2016/0172995 A1* | 6/2016 | Obiraki | ................. | H01L 25/162 361/728 |
| 2017/0112005 A1* | 4/2017 | Cole | .................... | H01L 23/5382 |
| 2019/0157221 A1* | 5/2019 | Soyano | ................... | H01L 25/18 |
| 2019/0334261 A1* | 10/2019 | Fees | ..................... | H01M 50/572 |

* cited by examiner

*Primary Examiner* — Hoa C Nguyen
(74) *Attorney, Agent, or Firm* — Haynes and Boone, LLP

(57) ABSTRACT

A power delivery system includes a first planar power module that is coupled to a power system and that transmits power received from the power system. A first planar power module connector is connected to the first planar power module and transmits the power received from the first planar power module. A second planar power module is connected to the first planar power module connector and transmits the power received from the first planar power module connector. A first power transmission coupling engages at least one of the first planar power module and the second planar power module, and receives the power from the at least one of the first planar power module and the second planar power module to which it is engaged, and transmits the power to a first component via a first power transmission pad coupled to the first component and engaging the first power transmission coupling.

20 Claims, 34 Drawing Sheets

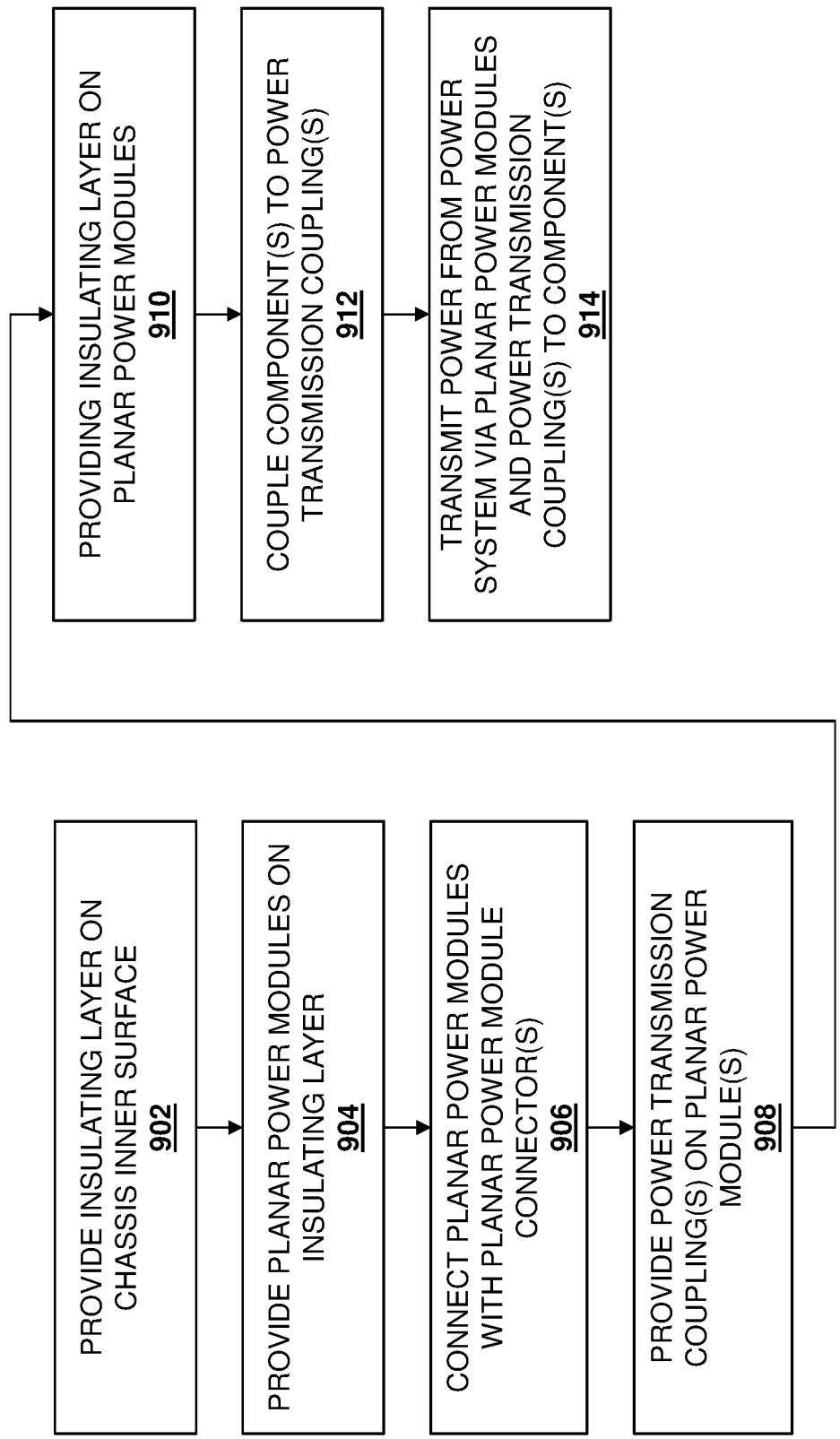

POWER DELIVERY SYSTEM

CROSS-REFERENCE TO RELATED APPLICATIONS

This application claims priority to Chinese Patent Application Serial No. 202010037781.7, filed Jan. 14, 2020, the disclosure of which is incorporated herein by reference in its entirety.

BACKGROUND

The present disclosure relates generally to information handling systems, and more particularly to delivering power to information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, include power delivery systems in their chassis in order to deliver power from a power system (e.g., provided by Power Supply Unit(s) (PSU(s)), power adapter device(s), and/or other power system components known in the art.) Conventional power delivery systems may utilize power cabling, power interposer boards, busbars, and/or other power delivery components to deliver power within the chassis of the server device. For example, power from PSUs in the chassis of the server device is often delivered to a circuit board via the use of power cabling, and then delivered via the circuit board to components coupled to that circuit board using power traces in the circuit board. However, as circuit board designs become denser (e.g., as server device sizes are reduced), utilize higher power (e.g., for the operation of higher power Central Processing Units (CPUs) and Graphics Processing Units (GPUs)), and/or provide higher signal speeds (e.g., for generation 4, 5, and or 6 Peripheral Component Interconnect express (PCIe) applications), it is becoming more and more difficult to integrate power and signal routing into such circuit boards. As would be understood by one of skill in the art, circuit boards in such high power implementations require a power plane/layer that is large enough to carry the required current, while providing high speed signal routing that avoids that power plane/layer.

Furthermore, the interconnection of power delivery components is required throughout the chassis of the server device, and often utilizes relatively large amounts of the available volume in that chassis, while also negatively effecting heat dissipation throughout the chassis (e.g., by producing heat and/or blocking airflow.) In a specific example, power delivery components utilized with the power cabling/circuit board power plane power delivery discussed above may utilize approximately 20% of the available volume in the chassis of the server device, effecting approximately 20% of the chassis airflow, and increasing the cost of the system by approximately 20% with regard to power delivery and thermal cooling. As discussed above, in some embodiments a busbar may be provided on the motherboard, which one of skill in the art will recognize allows the removal of high power delivery planes/layers from the circuit board that can interfere with the high speed signal routing in the circuit board. However, busbars utilize space in and adjacent the top layer of the circuit board, impacting the positioning of components (e.g., the CPU, memory, etc.) on the circuit board. Furthermore, busbars typically provide a unique design that depends on the circuit board layout, which increases the design complexity and cost of the server device. Further still, the busbar extends above the circuit board surface to impact airflow through the chassis, limits the circuit board layout, and results in other deficiencies that would be apparent to one of skill in the art.

Accordingly, it would be desirable to provide a power delivery system that addresses the issues discussed above.

SUMMARY

According to one embodiment, an Information Handling System (IHS) includes a chassis including a chassis inner surface; a circuit board that is included in the chassis and that includes a first transmission pad that is coupled to a first component on the circuit board; a first planar power module that is located between the chassis inner surface and the circuit board, coupled to a power system, and configured to transmit power received from the power system; a first planar power module connector that is located between the chassis inner surface and the circuit board, connected to the first planar power module, and configured to transmit the power received from the first planar power module; a second planar power module that is located between the chassis inner surface and the circuit board, connected to the first planar power module connector, and configured to transmit the power received from the first planar power module connector; and a first power transmission coupling engaging the first transmission pad included on the circuit board and at least one of the first planar power module and the second planar power module, wherein the first power transmission coupling is configured to receive the power from the at least one of the first planar power module and the second planar power module to which the first power transmission coupling is engaged, and transmit the power via the first transmission pad to the first component on the circuit board.

BRIEF DESCRIPTION OF THE DRAWINGS

FIG. 9 is a flow chart illustrating an embodiment of a method for delivering power.

FIG. 11B is a schematic perspective view illustrating an embodiment of the planar power modules provided in the chassis of FIG. 11a.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
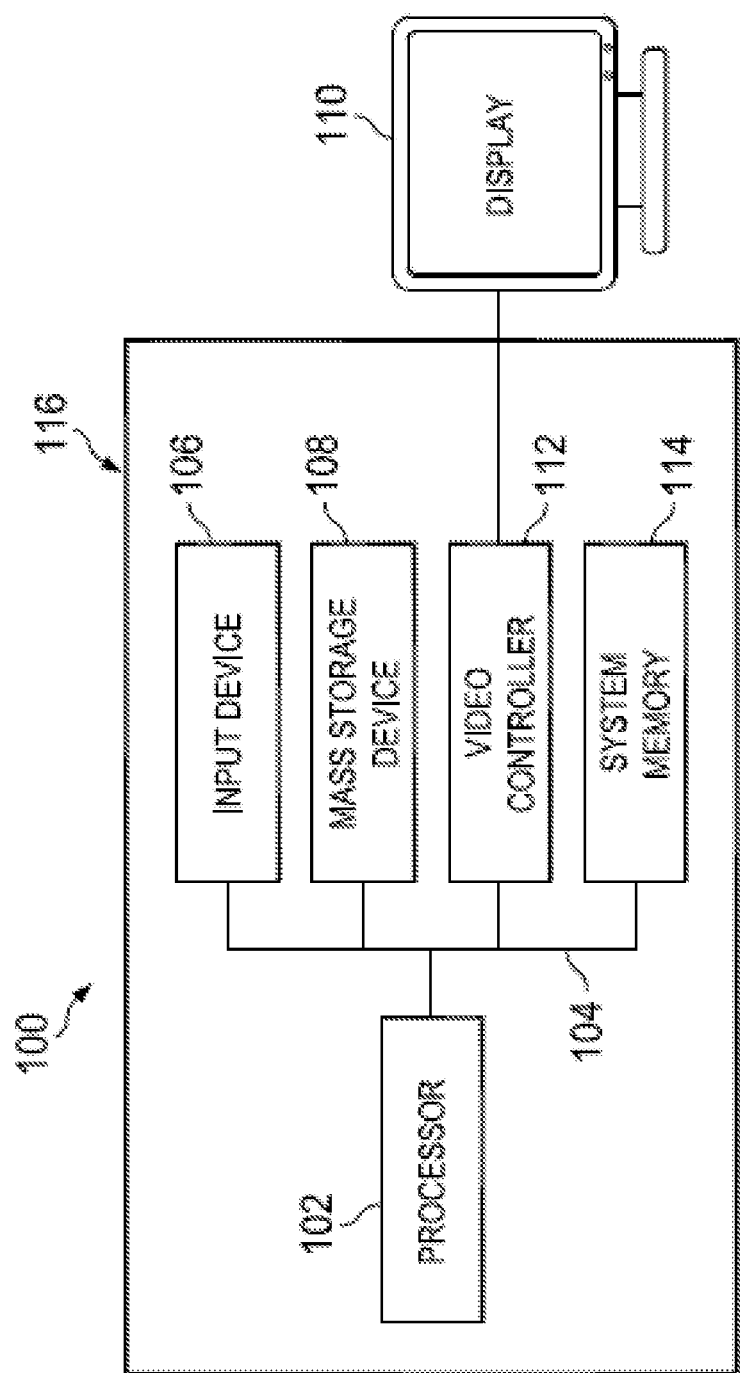
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
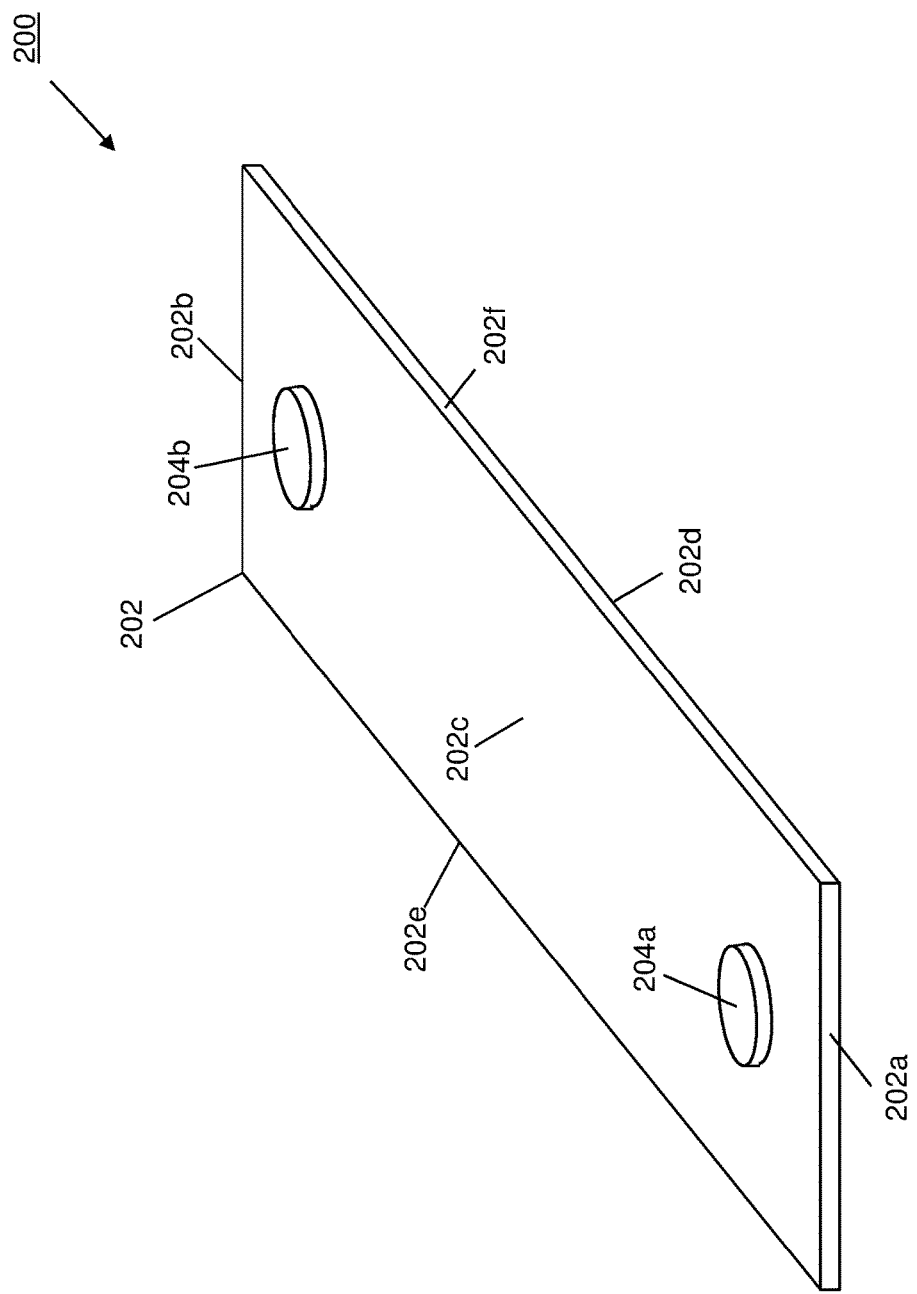
FIG. 2 is a schematic perspective view illustrating an embodiment of a planar power module.

Referring now to FIG. 2, an embodiment of a planar power module 200 is illustrated. In the illustrated embodiment, the planar power module 200 incudes a base 202 having a front edge 202a, a rear edge 202b that is located opposite the base 202 from the front edge 202a, a top surface 202c that extends between the front edge 202a and the rear edge 202b, a bottom surface 202d that is located opposite the base 202 from the top surface 202c and that extends between the front edge 202a and the rear edge 202b, and a pair of opposing side edges 202e and 202f that are located opposite the base 202 from each other and that extends between the front edge 202a, the rear edge 202b, the top surface 202c, and the bottom surface 202d. As illustrated, the base 202 may be provided as a substantially flat, planar member, although one of skill in the art in possession of the present disclosure will appreciate that other shapes and configurations of the planar power module 200 may be provided while remaining within the scope of the present disclosure as well.

In addition, one of skill in the art in possession of the present disclosure will recognize that the base 202 may be provided by a power transmitting material such as, for example, copper or other materials that are capable of transmitting power in an amount sufficient to provide for the operation of an information handling system such as a server device, a networking device (e.g., a switch device), a storage system, a desktop computing device, a laptop/notebook computing device, a tablet computing device, a mobile phone, and/or other computing devices known in the art. As such, one of skill in the art in possession of the present disclosure will recognize that the dimensions of the base 202 may be modified to provide for sufficient transmission of power for any particular application, with the base 202 including power transmitting material ranging from a thin planar foil (e.g., a copper foil), to a relatively thick planar plate (e.g., a copper plate). However, while a few examples are provided, one of skill in the art in possession of the present disclosure will appreciate that different materials provided in different shapes will fall within the scope of the present disclosure as well.

In the illustrated embodiment, a plurality of planar power module couplings 204a and 204b extend from the top surface 202c of the base 202 adjacent the front edge 202a and the rear edge 202b, respectively. Furthermore, as discussed below, the base 202 may include insulating materials that provide its top surface 202c and bottom surface 202d (e.g., the base 202 may be provided by a circuit board that includes a power plane/layer), with the planar power module couplings 204a and 204b providing access to the power transmitting material in the base 202. However, while the planar power module couplings 204a and 204b are illustrated as extending from the top surface 202c of the base 202, one of skill in the art in possession of the present disclosure will appreciate that planar power module couplings may extend into or be defined by the base 202, and/or may be provided by a variety of other coupling features that would be apparent to one of skill in the art in possession of the present disclosure. As such, while a specific planar power module 200 has been illustrated and described, one of skill in the art in possession of the present disclosure will recognize that the planar power modules of the present disclosure may be provided in a variety of manners with a variety of configurations that will fall within the scope of the present disclosure as well.

Figure 3A:
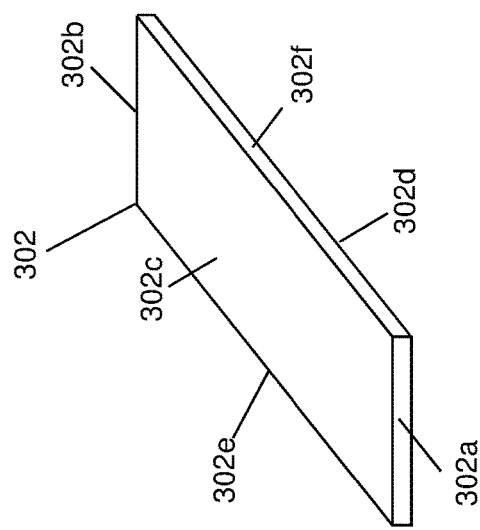
FIG. 3A is a schematic perspective top view illustrating an embodiment of a planar power module connector.
Figure 3B:
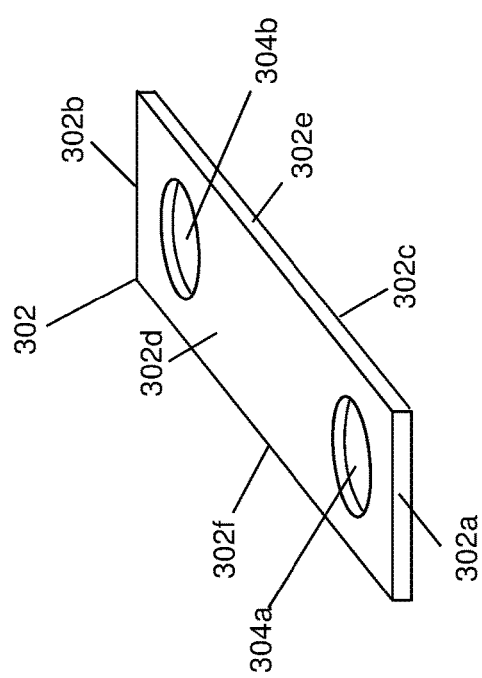
FIG. 3B is a schematic perspective bottom view illustrating an embodiment of the planar power module connector of FIG. 3A.

Referring now to FIGS. 3A and 3B, an embodiment of a planar power module connector 300 is illustrated. In the illustrated embodiment, the planar power module connector 300 incudes a base 302 having a front edge 302a, a rear edge 302b that is located opposite the base 302 from the front edge 302a, a top surface 302c that extends between the front edge 302a and the rear edge 302b, a bottom surface 302d that is located opposite the base 302 from the top surface 302c and that extends between the front edge 302a and the rear edge 302b, and a pair of opposing side edges 302e and 302f that are located opposite the base 302 from each other and that extends between the front edge 302a, the rear edge 302b, the top surface 302c, and the bottom surface 302d. As illustrated, the base 302 may be provided as a substantially flat, planar member, although one of skill in the art in possession of the present disclosure will appreciate that other shapes and configurations of the planar power module connector 300 may be provided while remaining within the scope of the present disclosure as well.

In addition, one of skill in the art in possession of the present disclosure will recognize that the base 302 may be provided by a power transmitting material such as, for example, copper or other materials that are capable of transmitting power in an amount sufficient to provide for the operation of an information handling system such as a server device, a networking device (e.g., a switch device), a storage system, a desktop computing device, a laptop/notebook computing device, a tablet computing device, a mobile phone, and/or other computing devices known in the art. As such, one of skill in the art in possession of the present disclosure will recognize that the dimensions of the base 302 may be modified to provide for sufficient transmission of power for any particular application. However, one of skill in the art in possession of the present disclosure will appreciate that different materials provided in different shapes will fall within the scope of the present disclosure as well.

In the illustrated embodiment, a plurality of planar power module connector couplings 304a and 304b are defined by the base 300 and extend into the bottom surface 302d of the base 302 adjacent the front edge 302a and the rear edge 302b, respectively. Furthermore, as discussed below, the base 302 may include insulating materials that provide its top surface 302c and bottom surface 302d (e.g., the base 302 may be provided by a circuit board that includes a power plane/layer), with the planar power module connector couplings 304a and 304b providing access to the power transmitting material in the base 302. However, while the planar power module connector couplings 304a and 304b are illustrated as extending into the bottom surface 302c of the base 302, one of skill in the art in possession of the present disclosure will appreciate that planar power module connector couplings may extend from the base 302, and/or may be provided by a variety of other coupling features that would be apparent to one of skill in the art in possession of the present disclosure. As such, while a specific planar power module connector 300 has been illustrated and described, one of skill in the art in possession of the present disclosure will recognize that the planar power module connectors of the present disclosure may be provided in a variety of manners with a variety of configurations that will fall within the scope of the present disclosure as well.

Figure 4A:
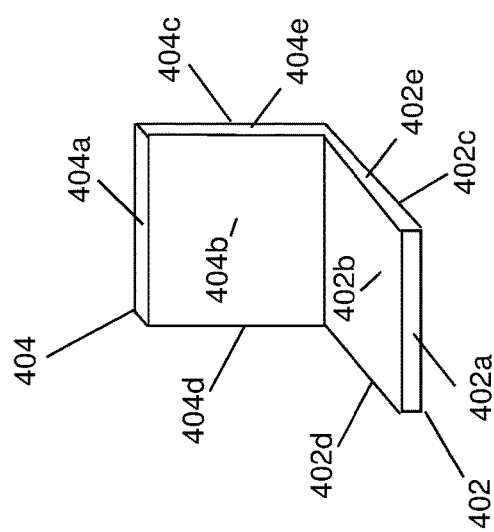
FIG. 4A is a schematic perspective front view illustrating an embodiment of a planar power module connector.
Figure 4B:
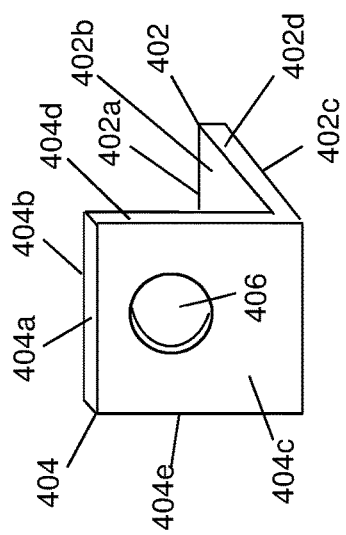
FIG. 4B is a schematic perspective rear view illustrating an embodiment of the planar power module connector of FIG. 4A

Referring now to FIGS. 4A and 4B, an embodiment of a planar power module connector 400 is illustrated. In the illustrated embodiment, the planar power module connector 400 incudes a first base portion 402 having a front edge 402a, a top surface 402b that extends from the front edge 402a, a bottom surface 402c that is located opposite the first base portion 402 from the top surface 402b and that extends from the front edge 402a, and a pair of opposing side edges 402d and 402e that are located opposite the base 402 from each other and that extend from the front edge 402a, the top surface 402b, and the bottom surface 402c. In the illustrated embodiment, the planar power module connector 400 also incudes a second base portion 404 having a top edge 404a, a front surface 404b that extends from the top edge 404a, a rear surface 404c that is located opposite the second base portion 404 from the front surface 404b and that extends from the top edge 404a, and a pair of opposing side edges 404d and 404e that are located opposite the base 404 from each other and that extend from the top edge 404a, the front surface 404b, and the rear surface 404c. As illustrated, the first base portion 402 and the second base portion 404 are provided in a substantially perpendicular orientation to each other, although one of skill in the art in possession of the present disclosure will appreciate that other shapes and configurations of the planar power module connector 400 may be provided while remaining within the scope of the present disclosure as well.

In addition, one of skill in the art in possession of the present disclosure will recognize that the first base portion 402 and the second base portion 404 may be provided by a power transmitting material such as, for example, copper or other materials that are capable of transmitting power in an amount sufficient to provide for the operation of an information handling system such as a server device, a networking device (e.g., a switch device), a storage system, a desktop computing device, a laptop/notebook computing device, a tablet computing device, a mobile phone, and/or other computing devices known in the art. As such, one of skill in the art in possession of the present disclosure will recognize that the dimensions of first base portion 402 and the second base portion 404 may be modified to provide for sufficient transmission of power for any particular application. However, one of skill in the art in possession of the present disclosure will appreciate that different materials provided in different shapes will fall within the scope of the present disclosure as well.

In the illustrated embodiment, a planar power module connector coupling 406 is defined by the second base portion 404 and extends into the rear surface 404c of the base 404 and, while not illustrated, a similar planar power module connector coupling may be defined by the first base portion 402 and extend into the bottom surface 402c of the base 402 as well. Furthermore, as discussed below, the base 402 may include insulating materials that provide its top surface 402c, front surface 404b, bottom surface 402c, and rear surface 404c (e.g., the first base portion 402 and second base portion 404 may be provided by a circuit board that includes a power plane/layer), with the planar power module connector couplings (e.g., the planar power module connector coupling 406) providing access to the power transmitting material in the first base portion 402 and second base portion 404. However, while the planar power module connector couplings illustrated and/or described as extending into the first base portion 402 and second base portion 404, one of skill in the art in possession of the present disclosure will appreciate that planar power module connector couplings may extend from the first base portion 402 and second base portion 404, and/or may be provided by a variety of other coupling features that would be apparent to one of skill in the art in possession of the present disclosure. As such, while a specific planar power module connector 400 has been illustrated and described, one of skill in the art in possession of the present disclosure will recognize that the planar power module connectors of the present disclosure may be provided in a variety of manners with a variety of configurations that will fall within the scope of the present disclosure as well.

Figure 5:
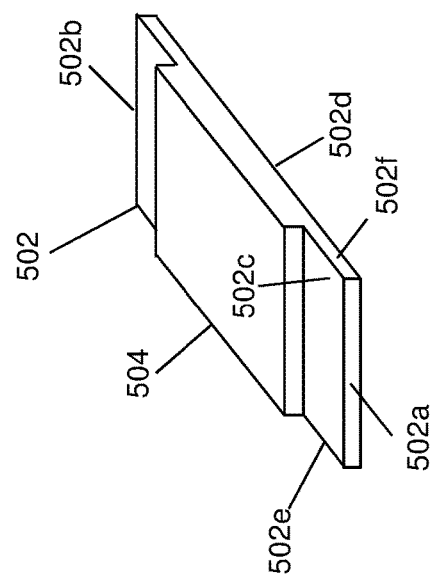
FIG. 5 is a schematic perspective view illustrating an embodiment of a power transmission coupling.

Referring now to FIG. 5, an embodiment of a planar transmission coupling 500 is illustrated. In the illustrated embodiment, the planar transmission coupling 500 incudes a base 502 having a front edge 502a, a rear edge 502b that is located opposite the base 502 from the front edge 502a, a top surface 502c that extends between the front edge 502a and the rear edge 502b, a bottom surface 502d that is located opposite the base 502 from the top surface 502c and that extends between the front edge 502a and the rear edge 502b, and a pair of opposing side edges 502e and 502f that are located opposite the base 502 from each other and that extends between the front edge 502a, the rear edge 502b, the top surface 502c, and the bottom surface 502d. Furthermore, a pad engagement member 504 extends from the top surface 502c of the base 502. As illustrated, the base 502 may be provided as a substantially flat, planar member with a centrally located pad engagement member, although one of skill in the art in possession of the present disclosure will appreciate that other shapes and configurations of the planar transmission coupling 500 may be provided while remaining within the scope of the present disclosure as well.

In addition, one of skill in the art in possession of the present disclosure will recognize that the base 502 and pad engagement member 504 may be provided by a power transmitting material such as, for example, a conductive rubber material and/or other materials that are capable of engaging the power transmission pads discussed below to transmit power in an amount sufficient to provide for the operation of information handling system components that may be provided in a server device, a networking device (e.g., a switch device), a storage system, a desktop computing device, a laptop/notebook computing device, a tablet computing device, a mobile phone, and/or other computing devices known in the art. As such, one of skill in the art in possession of the present disclosure will recognize that the dimensions of the base 502 and pad engagement member 504 may be modified to provide for sufficient transmission of power for any particular application. However, while a few examples are provided, one of skill in the art in possession of the present disclosure will appreciate that different materials provided in different shapes will fall within the scope of the present disclosure as well. Furthermore, while a specific planar transmission coupling 500 has been illustrated and described, one of skill in the art in possession of the present disclosure will recognize that the planar transmission coupling of the present disclosure may be provided in a variety of manners with a variety of configurations that will fall within the scope of the present disclosure as well.

Figure 6:
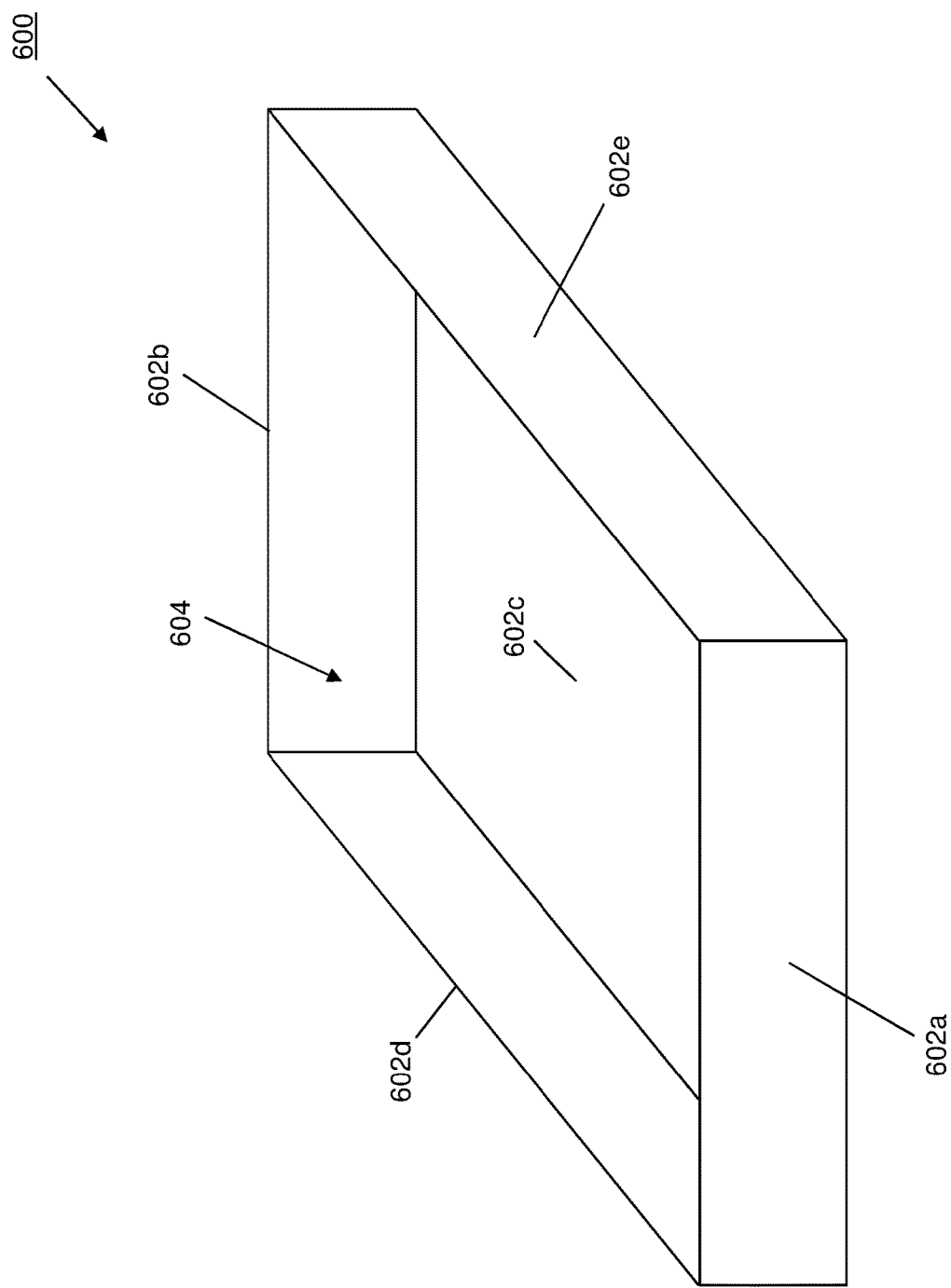
FIG. 6 is a schematic perspective view illustrating an embodiment of a chassis.

Referring now to FIG. 6, an embodiment of a chassis 600 is illustrated. In the illustrated embodiment, the chassis 600 includes a front wall 602a, a rear wall 602b that is located opposite the chassis 600 from the front wall 602a, a bottom wall 602c that extends between the front wall 602a and the rear wall 602b, and a pair of opposing side walls 602d and 602e that are located opposite the chassis 600 from each other and that extend between the front wall 602a, the rear wall 602b, and the bottom wall 602c. As illustrated, a chassis housing 604 is defined between the front wall 602a, the rear wall 602b, the bottom wall 602c, and the side walls 602d and 602e, with each of the front wall 602a, the rear wall 602b, the bottom wall 602c, and the side walls 602d and 602e providing a chassis inner surface that is located immediately adjacent the chassis housing 604.

One of skill in the art in possession of the present disclosure will appreciate that the embodiment of the chassis 600 illustrated in FIG. 6 is greatly simplified for discussion below, and will typically include many other components and/or features, including features for coupling the components of the power delivery system discussed below to different portions of the chassis 600. For example, the chassis 600 may include a top cover that may engage the front wall 602a, the rear wall 602b, and the side walls 602d and 602e in order to enclose the chassis housing 604. In addition, one of skill in the art in possession of the present disclosure will appreciate that the chassis 600 may also include any of a variety of information handling system components (e.g., server components) in the chassis housing 604, routing and mounting features (e.g., on the front wall 602a, the rear wall 602b, the bottom wall 602c, and/or the side walls 602d and 602e), and/or any other chassis elements or features that would be apparent to one of skill in the art in possession of the present disclosure. As such, while a specific chassis 600 is illustrated and described, one of skill in the art in possession of the present disclosure will recognize that the chassis utilized in the present disclosure may be provided in a variety of manners with a variety of configurations that will fall within the scope of the present disclosure as well.

Figure 7A:
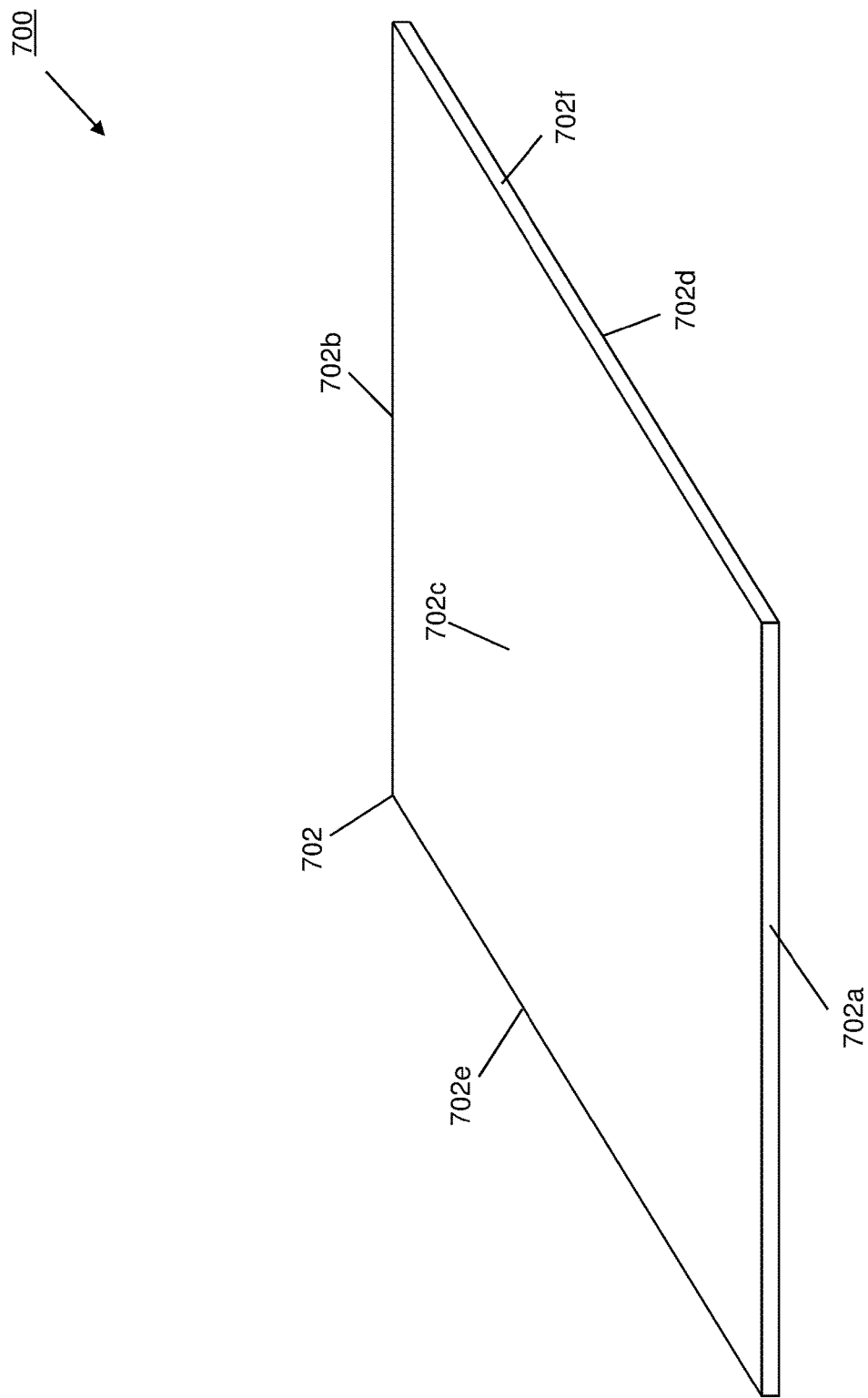
FIG. 7A is a schematic perspective top view illustrating an embodiment of a circuit board.
Figure 7B:
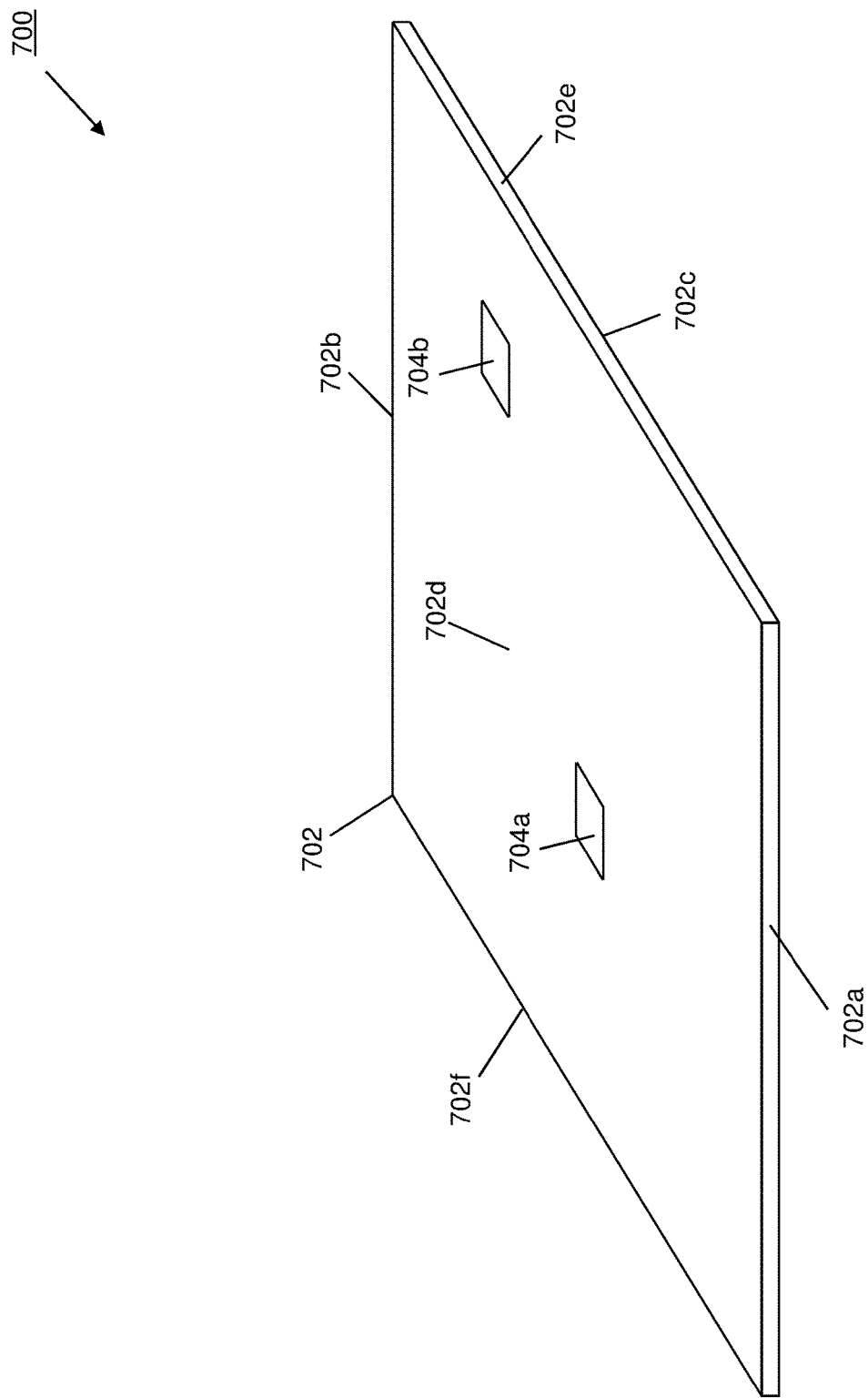
FIG. 7B is a schematic perspective bottom view illustrating an embodiment of the circuit board of FIG. 7A.

Referring now to FIGS. 7A and 7B, an embodiment of a circuit board 700 is illustrated. In the illustrated embodiment, the circuit board 700 incudes a base 702 having a front edge 702a, a rear edge 702b that is located opposite the base 702 from the front edge 702a, a top surface 702c that extends between the front edge 702a and the rear edge 702b, a bottom surface 702d that is located opposite the base 702 from the top surface 702c and that extends between the front edge 702a and the rear edge 702b, and a pair of opposing side edges 702e and 702f that are located opposite the base 702 from each other and that extends between the front edge 702a, the rear edge 702b, the top surface 702c, and the bottom surface 702d. As will be appreciated by one of skill in the art in possession of the present disclosure, any of a variety of components may be mounted or coupled to the base 702 including processors, memory devices, storage devices, and/or other circuit board components known in the art, and those components have been omitted for clarity in the illustrations associated with the discussions below.

In different embodiment, the circuit board 700 be provided in a server device, a networking device (e.g., a switch device), a storage system, a desktop computing device, a laptop/notebook computing device, a tablet computing device, a mobile phone, and/or other computing devices known in the art. As such, one of skill in the art in possession of the present disclosure will recognize that the dimensions of the base 702 may be modified for any particular application. In the illustrated embodiment, a plurality of power transmission pads 704a and 704b are located on the bottom surface 702d of the base 702, and may each be coupled to one or more component coupled to or mounted on the base 702. As such, in a specific example, the power transmission pads 704a and 704b may be located on the bottom surface 702d of the base 702 immediately opposite the base 702 from a component mounted to the top surface 702c of the base 702, which may eliminate the need to provide power planes/layers/couplings (e.g., power traces) throughout the base 702, and rather provides for the direct connection of power provided to the power transmission pads 704a and 704b to those components. However, while a specific configuration of power transmission pads 704a and 704b and components has been described, one of skill in the art in possession of the present disclosure will appreciate that the power transmission pads and the component to which they provide power may be oriented, configured, and/or provided in a variety of manners that will fall within the scope of the present disclosure as well. As such, while a specific circuit board has been illustrated and described, one of skill in the art in possession of the present disclosure will recognize that the circuit boards of the present disclosure may be provided in a variety of manners with a variety of component configurations that will fall within the scope of the present disclosure as well.

Figure 8A:
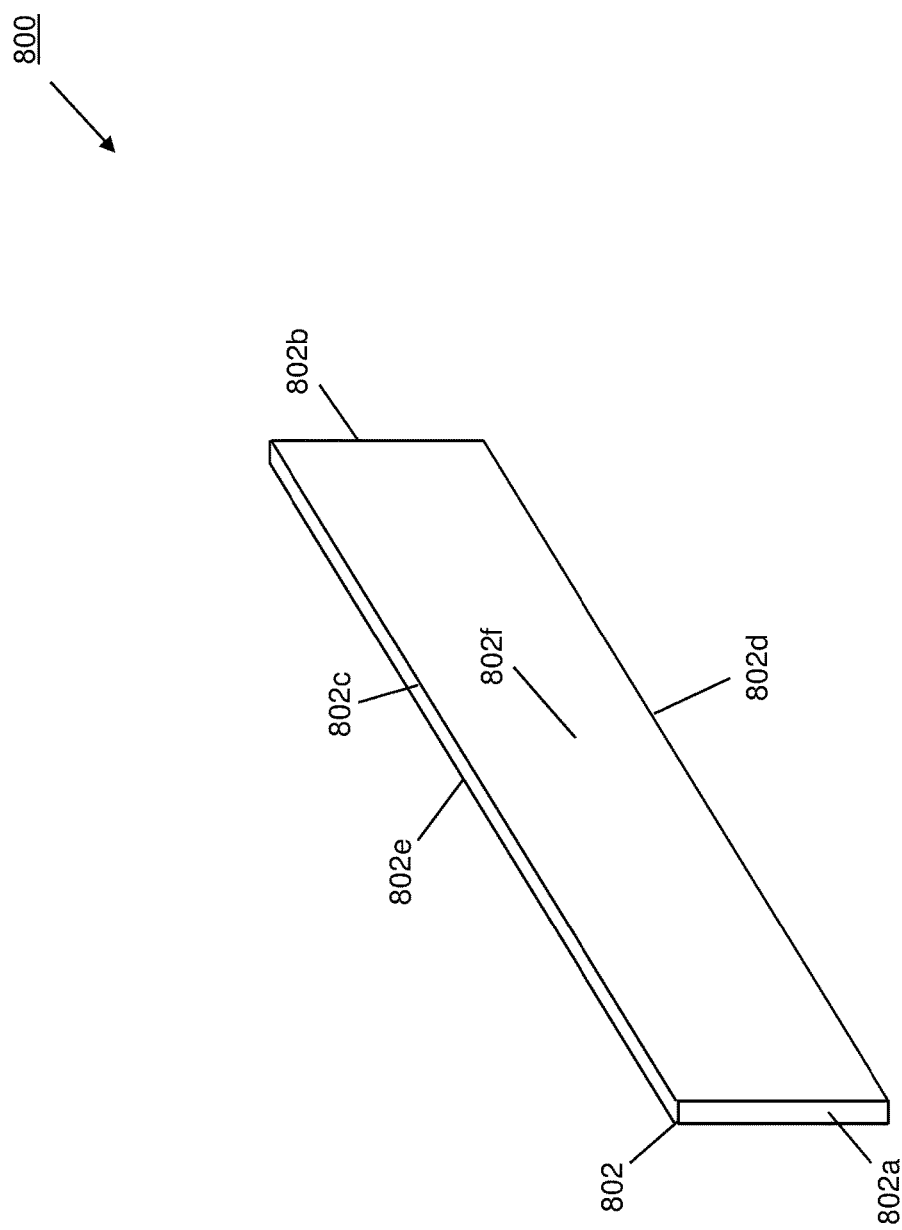
FIG. 8A is a schematic perspective front view illustrating an embodiment of a circuit board.
Figure 8B:
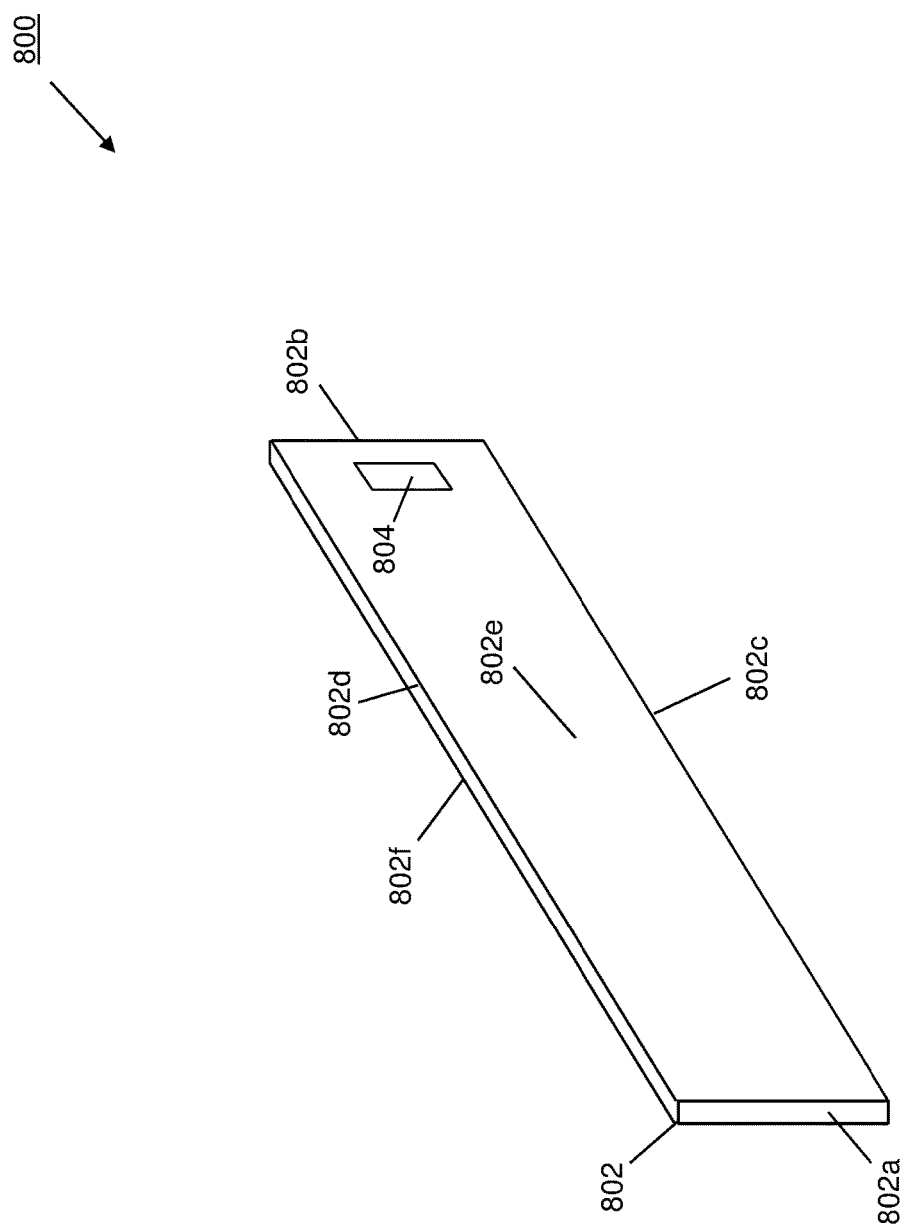
FIG. 8B is a schematic perspective rear view illustrating an embodiment of the circuit board of FIG. 8A.

Referring now to FIGS. 8A and 8B, an embodiment of a circuit board 800 is illustrated. In the illustrated embodiment, the circuit board 800 incudes a base 802 having a front edge 802a, a rear edge 802b that is located opposite the base 802 from the front edge 802a, a top edge 802c that extends between the front edge 802a and the rear edge 802b, a bottom edge 802d that is located opposite the base 802 from the top edge 802c and that extends between the front edge 802a and the rear edge 802b, and a pair of opposing side surfaces 802e and 802f that are located opposite the base 802 from each other and that extends between the front edge 802a, the rear edge 802b, the top edge 802c, and the bottom edge 802d. As will be appreciated by one of skill in the art in possession of the present disclosure, any of a variety of components may be mounted or coupled to the base 802 including processors, memory devices, storage devices, and/or other circuit board components known in the art, and those components have been omitted for clarity in the illustrations associated with the discussions below.

In different embodiment, the circuit board 800 be provided in a server device, a networking device (e.g., a switch device), a storage system, a desktop computing device, a laptop/notebook computing device, a tablet computing device, a mobile phone, and/or other computing devices known in the art. As such, one of skill in the art in possession of the present disclosure will recognize that the dimensions of the base 802 may be modified for any particular application. In the illustrated embodiment, a power transmission pad 804 is located on the side surface 802e of the base 802, and may be coupled to one or more components coupled to or mounted on the base 802. As such, in a specific example, the power transmission pad 804 may be located on the side surface 802e of the base 802 immediately opposite the base 802 from a component mounted to the side surface 802f of the base 802, which may eliminate the need to run power couplings (e.g., power traces) throughout the base 802, and rather provides for the direct connection of power provided to the power transmission pad 804 to those components. However, while a specific configuration of power transmission pad 804 and components has been described, one of skill in the art in possession of the present disclosure will appreciate that the power transmission pads and the component to which they provide power may be oriented, configured, and/or provided in a variety of manners that will fall within the scope of the present disclosure as well. As such, while a specific circuit board has been illustrated and described, one of skill in the art in possession of the present disclosure will recognize that the circuit boards of the present disclosure may be provided in a variety of manners with a variety of component configurations that will fall within the scope of the present disclosure as well.

Referring now to FIG. 9, an embodiment of a method 900 for delivering power is illustrated. As discussed below, embodiments of the systems and methods of the present disclosure provide for the delivery of power in an information handling system via one or more planar power modules that may be located between a chassis wall and a circuit board. For example, an insulating layer may be provided on one or more chassis inner surfaces provided by one or more chassis walls, and a plurality of the planar power modules may be provided on the insulting layer and connected together via planar power module connectors. One or more power transmission couplings may then be provided on the planar power modules, with the configuration of the planar power modules and the power transmission couplings provided according to a power delivery plan associated with the circuit boards and/or components that are to-be provided power in the chassis. An insulating layer may then be provided over the planar power modules and planar power module connectors, and the planar power modules may then be coupled to a power source (e.g., via one of the power transmission couplings). One or more circuit boards may then be provided in the chassis such that power transmission pads on the circuit boards that are coupled to components on the circuit board engage respective power transmission couplings. Power may then be provided from the power source, through the planar power modules and planar power module connectors, and via the power transmission couplings and power transmission pads to the components on the circuit board. As such, a power delivery system is provided that removes the need to route power via power planes/layers in the circuit boards, while also routing that power between the circuit boards and the chassis in a manner that does not substantially restrict airflow to the components in the chassis.

Figure 10A:
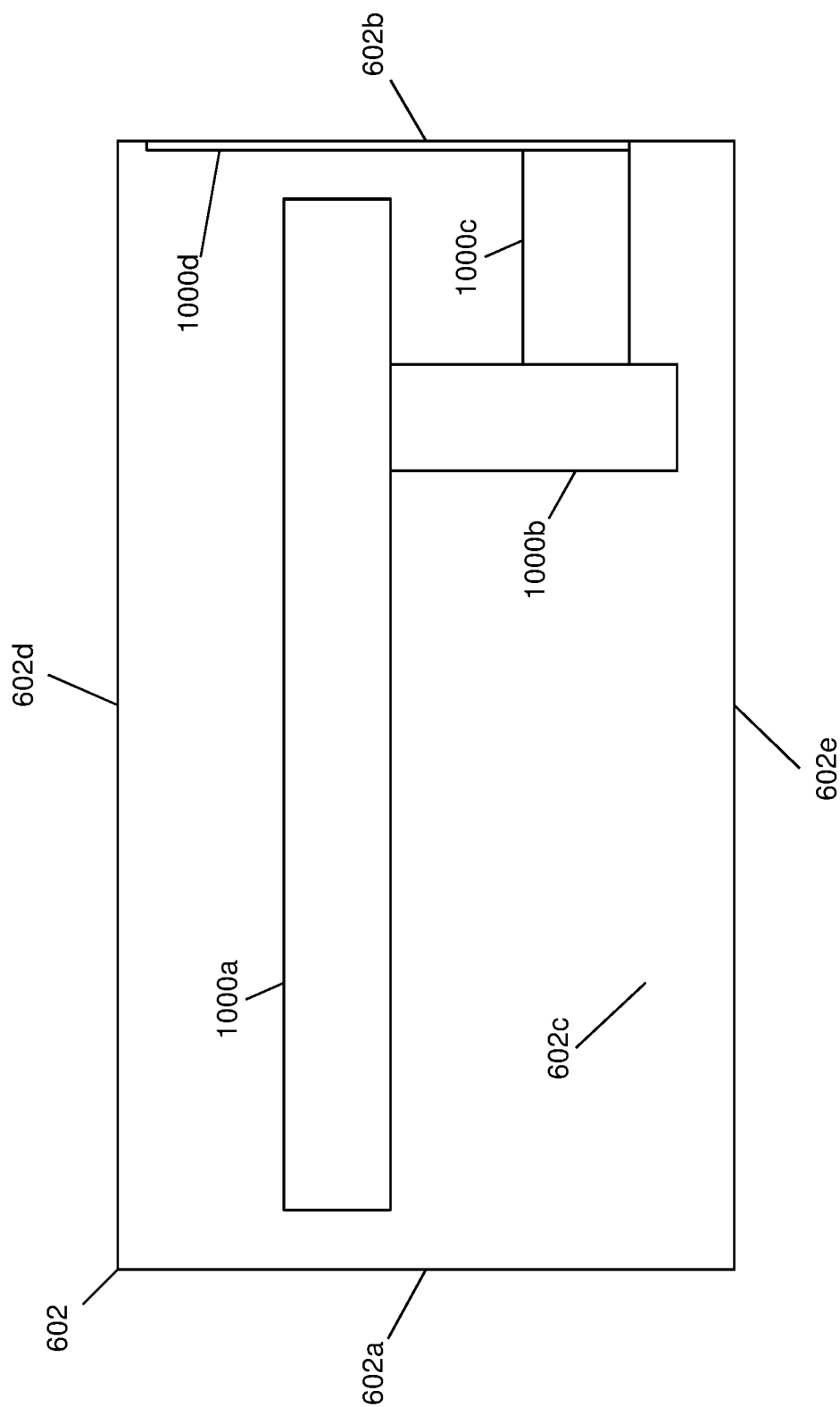
FIG. 10A is a schematic top view illustrating an embodiment of insulating layers provided in the chassis of FIG. 6.
Figure 10B:
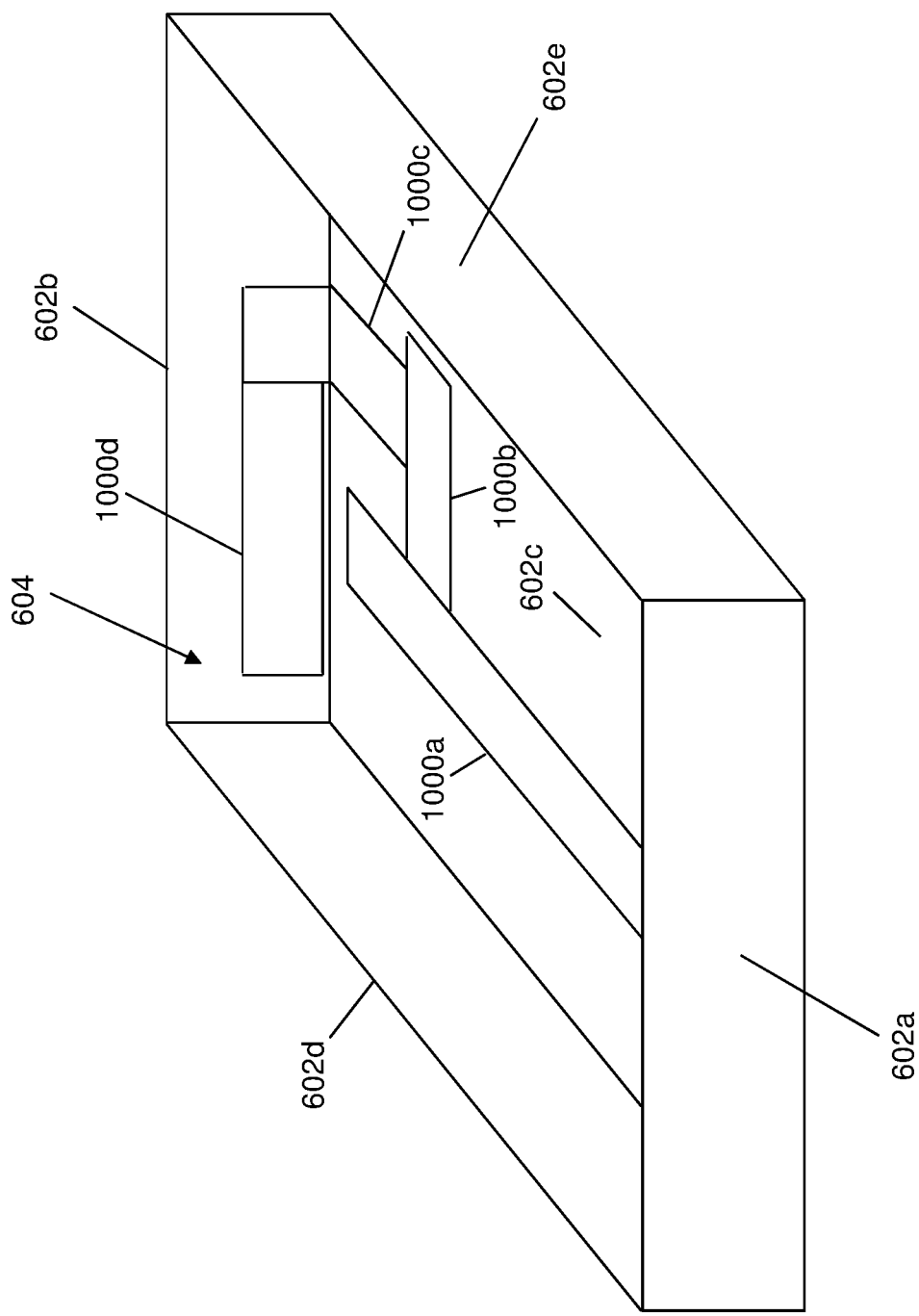
FIG. 10B is a schematic perspective view illustrating an embodiment of the insulating layers provided in the chassis of FIG. 10A.
Figure 10C:
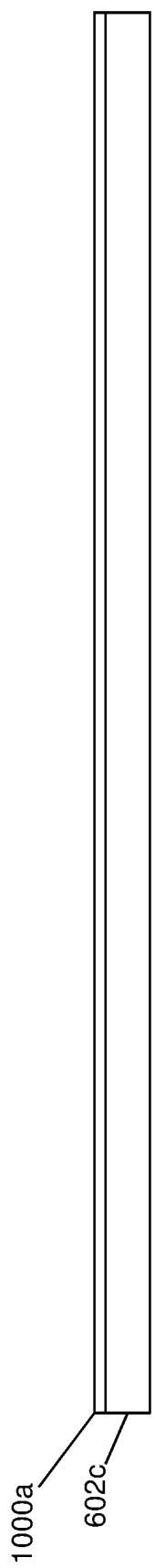
FIG. 10C is a schematic cross sectional view illustrating an embodiment of an insulating layer provided in the chassis of FIGS. 10A and 10B.

The method 900 begins at block 902 where an insulating layer is provided on a chassis inner surface. In an embodiment, at block 902, an insulating material may be utilized to provide an insulating layer on the chassis inner surface adjacent the chassis housing 604 based on a power routing plan for the information handling system (e.g., server device) provided in the chassis 600. As will be appreciated by one of skill in the art in possession of the present disclosure, prior to the method 900, the configurations and relative locations of components that will be provided in the chassis 600 may be determined, which allows a provider of the power delivery system of the present disclosure to determine how power will be routed through the chassis 600 according to the teachings of the present disclosure. As such, that power routing plan may be utilized to determine the configuration/routing of the insulting layer provided by the insulting material at block 902. For example, FIGS. 10A, 10B, and 10C illustrate insulating material 1000a, 1000b, and 1000c provided on the bottom wall 602c of the chassis 600, and insulating material 1000d provided on the rear wall 602b of the chassis 600, and one of skill in the art in possession of the present disclosure will appreciate how the routing illustrated in FIGS. 10A and 10B may be provided according to the power routing plan discussed above. In an embodiment, the insulting material that provides the insulting layer may include an adhesive to provide that insulting material on the chassis inner surface. For example an insulting tape may be used to provide the insulting layer at block 902, although one of skill in the art in possession of the present disclosure will appreciate that other materials and techniques for providing an insulting layer will fall within the scope of the present disclosure as well.

The method 900 then proceeds to block 904 where planar power modules are provided on the insulating layer. In an embodiment, at block 904, a plurality of planar power modules 200 may be provided on the insulating layer based on the power routing plan for the information handling system (e.g., server device) provided in the chassis 600. As discussed above, prior to the method 900, the configurations and relative locations of components that will be provided in the chassis 600 may be determined, which allows a provider of the power delivery system of the present disclosure to determine how power will be routed through the chassis 600 according to the teachings of the present disclosure. As such, that power routing plan may be utilized to determine the configuration/routing of the planar power modules 200 provided on the insulting layer at block 904, with adjacent planar power modules oriented such that respective planar power module couplings on those adjacent planar power modules are located adjacent each other at a distance that allows the planar power module connectors discussed below to connect those adjacent planar power modules via their planar power module couplings.

Figure 11A:
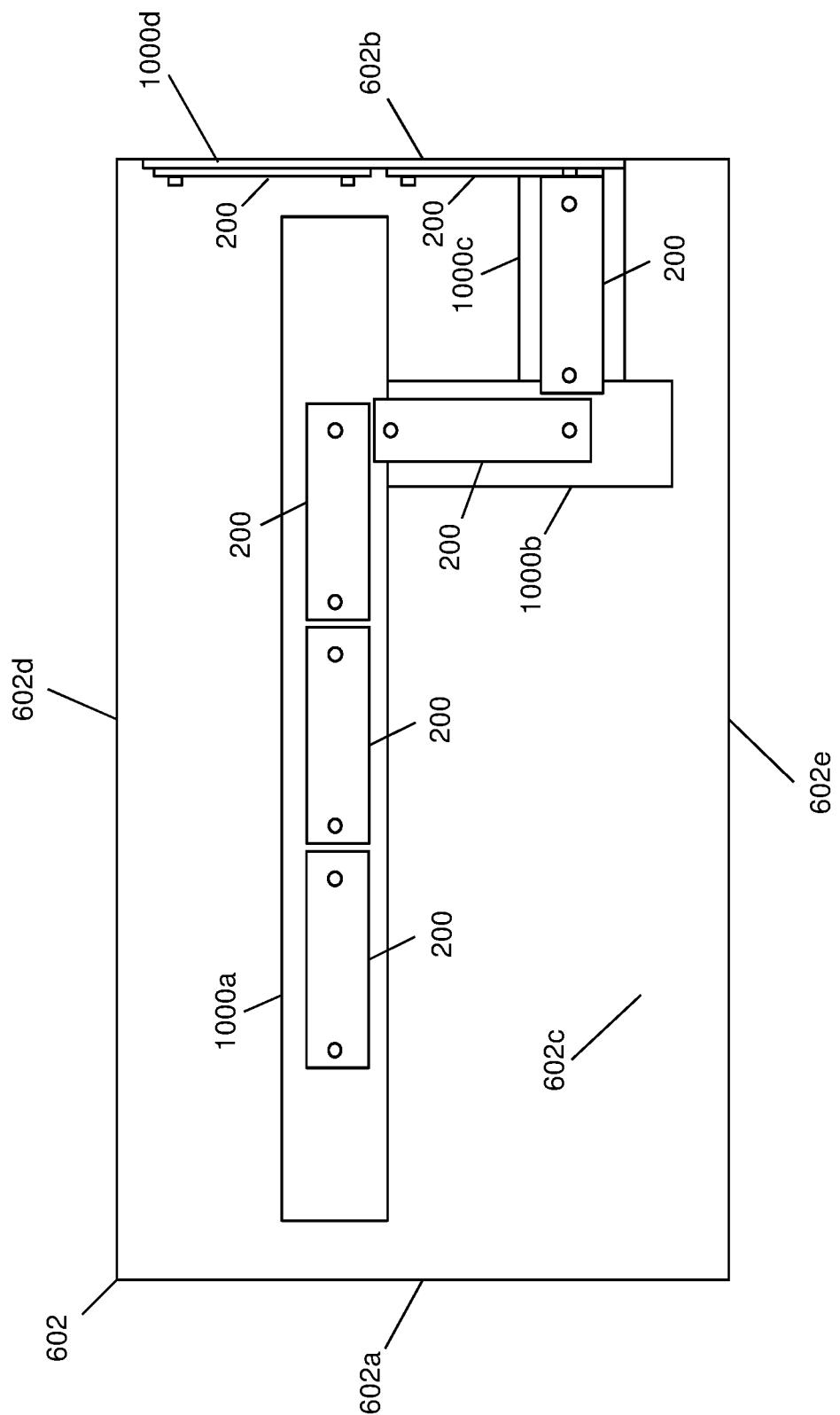
FIG. 11A is a schematic top view illustrating an embodiment of planar power modules of FIG. 2 provided in the chassis of FIG. 10A.
Figure 11B:
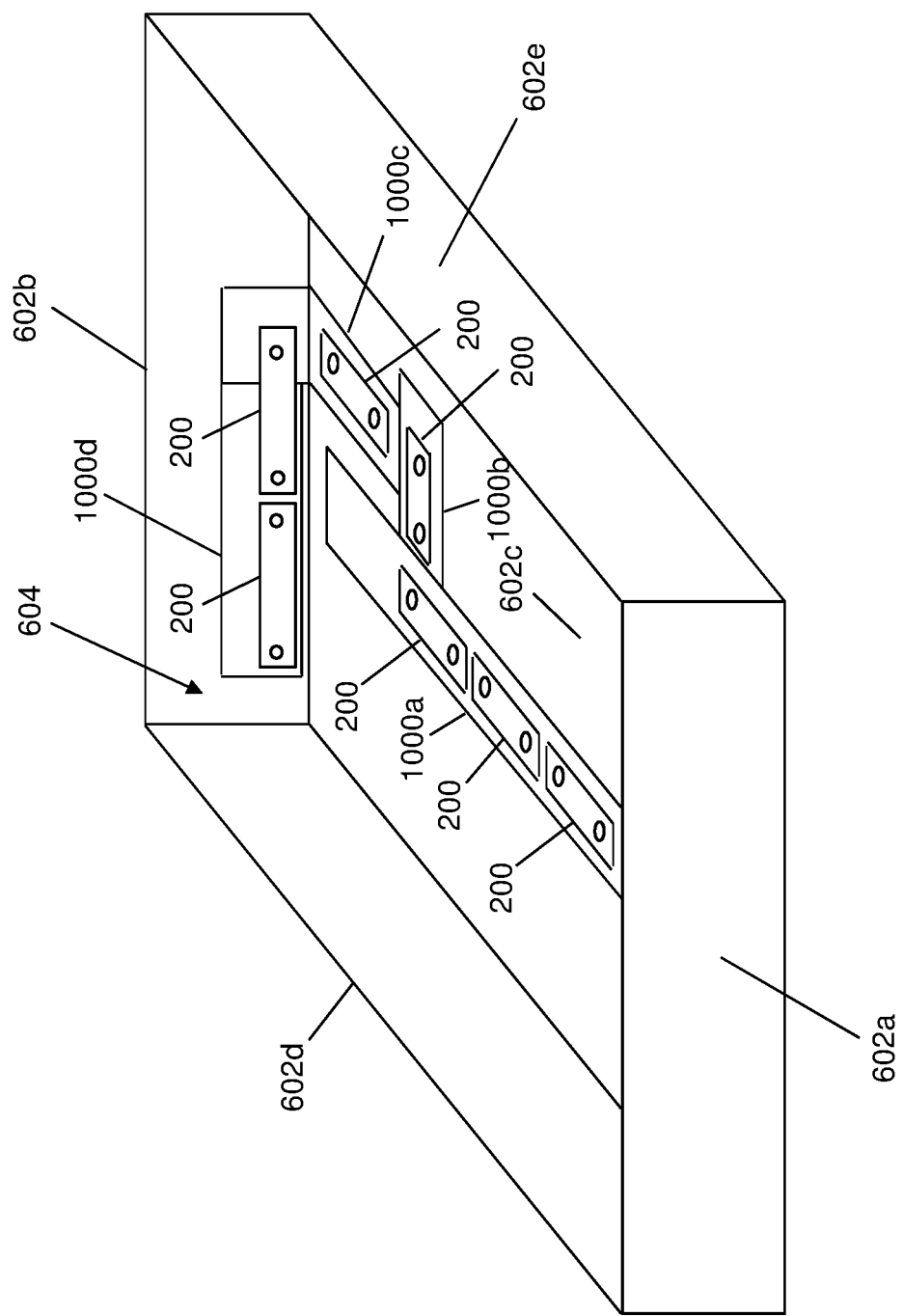
Figure 11C:
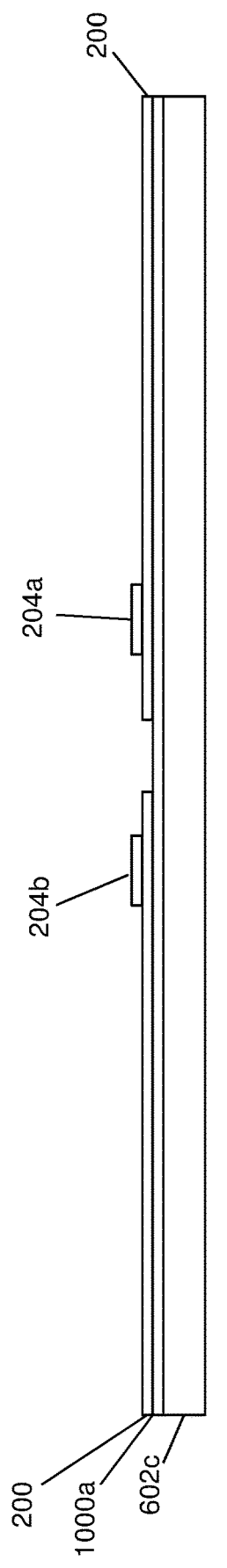
FIG. 11C is a schematic cross sectional view illustrating an embodiment of a planar power module provided in the chassis of FIGS. 11A and 11B.

For example, FIGS. 11A, 11B, and 11C illustrate three planar power modules 200 provided on the insulating material 1000a, a planar power module 200 provided on the insulating material 1000b, and a planar power module 200 provided on the insulating material 1000c, and two planar power modules 200 provided on the insulating material 1000d, and one of skill in the art in possession of the present disclosure will appreciate how the routing illustrated in FIGS. 11A and 11B may be provided according to the power routing plan discussed above. In an embodiment, the planar power modules 200 may include an adhesive to provide those planar power modules 200 on the insulating material. Furthermore, in some embodiments, the planar power modules 200 and the insulating material may be combined by, for example, providing an insulating material on the bottom surface 202d of the planar power module 200 with an adhesive that allows the planar power modules 200 to be adhered to the chassis inner surface with an insulating layer between the power conducting portion of the planar power module 200 and the chassis wall. As discussed above, the spacing of the planar power modules 200 on the insulating layer may be provided such that adjacent planar power module connectors on different planar power modules may be connected by the planar power module connectors discussed below.

The method 900 then proceeds to block 906 where planar power module connector(s) are provided to connect the planar power modules. In an embodiment, at block 906, a plurality of planar power module connectors 300 and/or 400 may be provided to connect adjacent planar power modules 200 included in the chassis 600. As discussed above, prior to the method 900, the configurations and relative locations of components that will be provided in the chassis 600 may be determined, which allows a provider of the power delivery system of the present disclosure to determine how power will be routed through the chassis 600 according to the teachings of the present disclosure. As such, that power routing plan may be utilized to determine the routing of the planar power modules 200 provided on the insulating layer at block 904, with adjacent planar power modules connected together using the planar power module connectors 300 and/or 400.

Figure 12A:
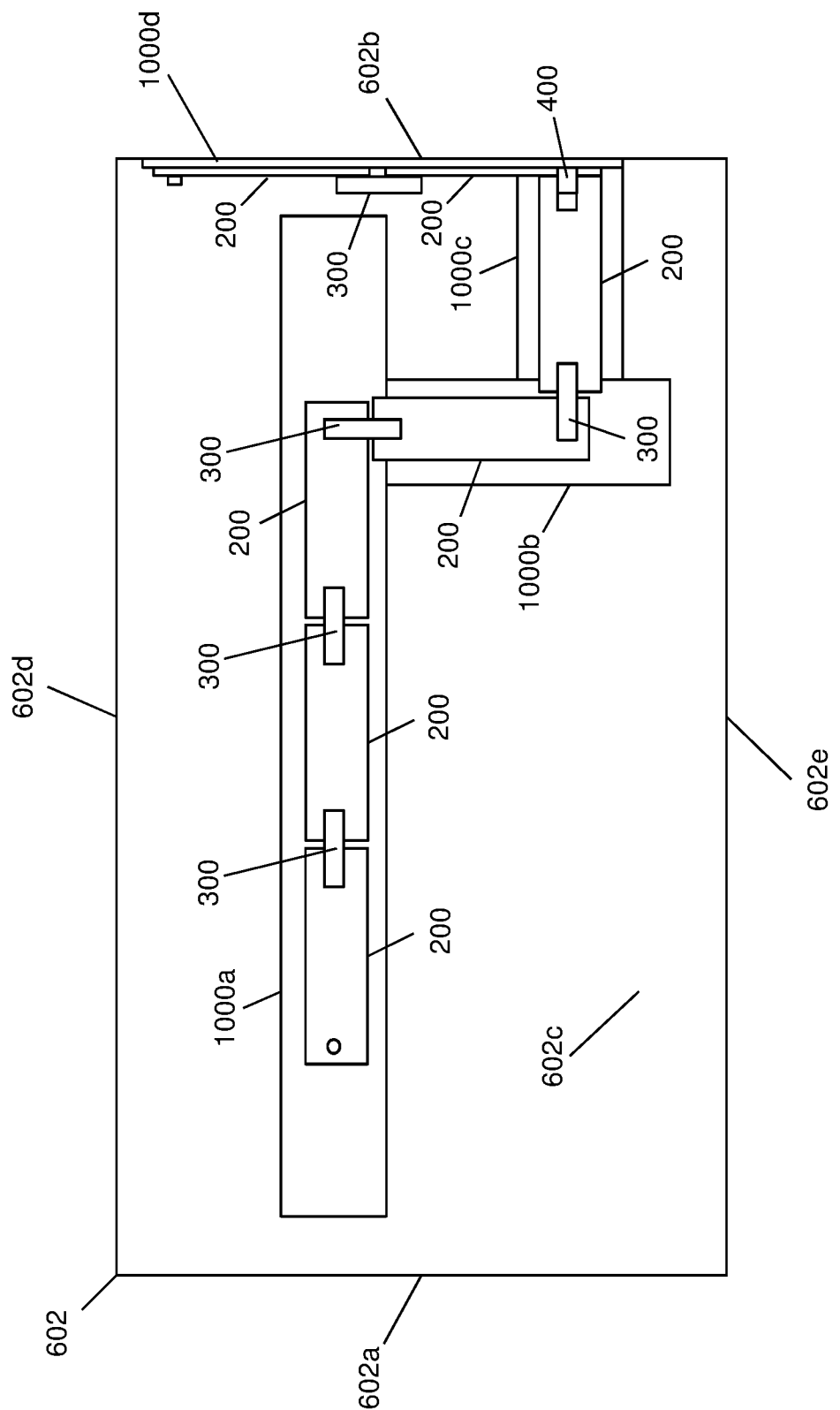
FIG. 12A is a schematic top view illustrating an embodiment of planar power module connectors of FIGS. 3A, 3B, 4A, and 4B provided in the chassis of FIG. 11A.
Figure 12B:
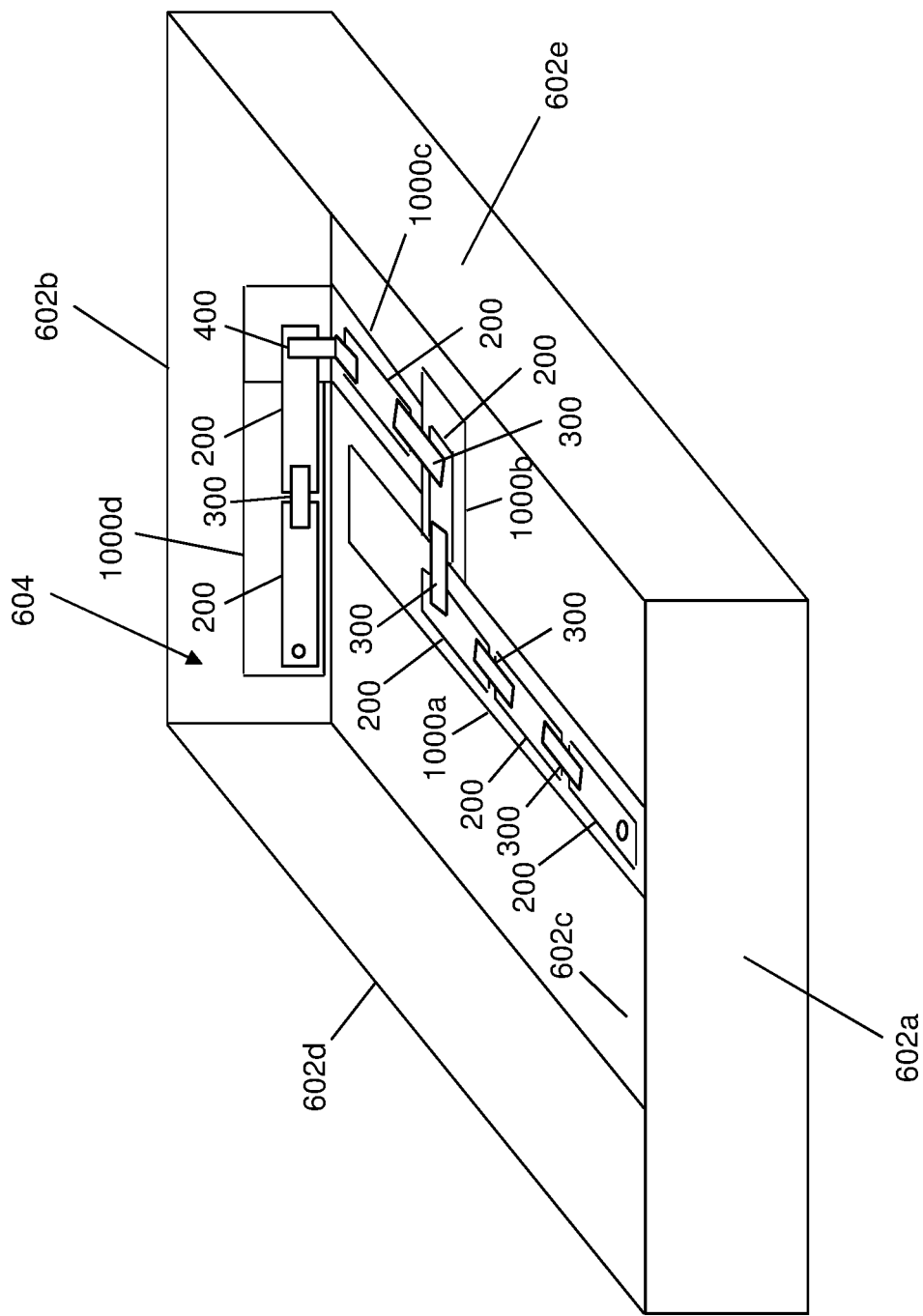
FIG. 12B is a schematic perspective view illustrating an embodiment of the planar power module connectors provided in the chassis of FIG. 12A.
Figure 12C:
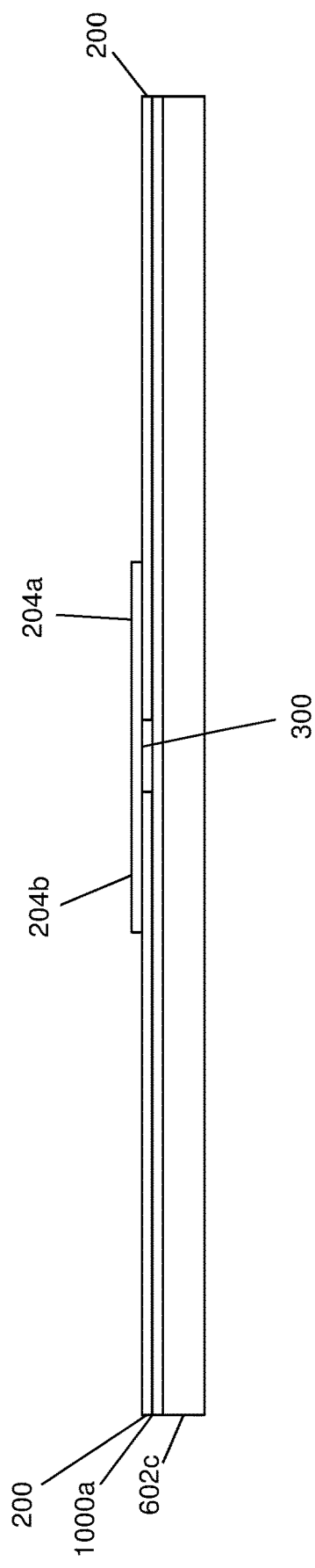
FIG. 12C is a schematic cross sectional view illustrating an embodiment of a planar power module connector provided in the chassis of FIGS. 12A and 12B.

For example, FIGS. 12A, 12B, and 12C illustrate the three planar power modules 200 provided on the insulating material 1000a connected together using two planar power module connectors 300, the planar power module 200 provided on the insulating material 1000b and connected to one of the planar power modules 200 provided on the insulating material 1000a by a planar power module connector 300, the planar power module 200 provided on the insulating material 1000c and connected to the planar power module 200 provided on the insulating material 1000b by a planar power module connector 300, and the two planar power modules 200 provided on the insulating material 1000d and connected together using a planar power module connector 300, with one of those planar power modules 200 provided on the insulating material 1000d connected to the planar power module 200 provided on the insulating layer 1000c by the planar power module connector 400, and one of skill in the art in possession of the present disclosure will appreciate how the routing illustrated in FIGS. 12A and 12B may be provided according to the power routing plan discussed above.

In an embodiment, any planar power module connector 300 may connect to adjacent planar power modules 200 by positioning a planar power module coupling 204a or 204b on one of the planar power modules 200 in one of the planar power module connector couplings 304a or 304b on the planar power module connector 300, and positioning a planar power module coupling 204a or 204b on the other adjacent planar power module 200 in the other of the respective planar power module connector couplings 304a or 304b on that planar power module connector 300. Similarly, the planar power module connector 400 may connect to adjacent planar power modules 200 by positioning a planar power module coupling 204a or 204b on one of the planar power modules 200 in one of the planar power module connector couplings (e.g., the planar power module connector coupling 406 illustrated in FIG. 4B) on the planar power module connector 400, and positioning a planar power module coupling 204a or 204b on the other adjacent planar power module 200 in the other of the respective planar power module connector couplings on that planar power module connector 400. As will be appreciated by one of skill in the art in possession of the present disclosure, the connections/couplings of adjacent planar power modules by the planar power module connectors 300 and/or 400 allow power transmitted to one of those planar power modules to be transmitted via the planar power module connector to the other of those planar power modules. As such, the configuration illustrated in FIGS. 12A and 12B allows power to be transmitted through each of the planar power modules 200 that have been provided in the chassis 600.

Furthermore, while a specific planar power module/planar power module connector configuration is illustrated in FIGS. 12A, 12B, and 12C, one of skill in the art in possession of the present disclosure will appreciate that the power delivery system of the present disclosure may provide a variety of power delivery configurations that will fall within the scope of the present disclosure as well. For example, separate power delivery configurations may be provided in a chassis to provide different power "rails" (e.g., a first set of planar power modules/planar power module connectors in a planar power module/planar power module connector configuration that provides a relatively high power rail, a second set of planar power modules/planar power module connectors in a planar power module/planar power module connector configuration that provides a relatively low power rail, and so on.) Furthermore, one of skill in the art in possession of the present disclosure will appreciate how the planar power module connectors allow multiple possible power delivery configurations to be provided in a chassis, and then one or more of those power delivery configurations to be optionally connected to a power source depending on the desired chassis configuration.

Figure 13A:
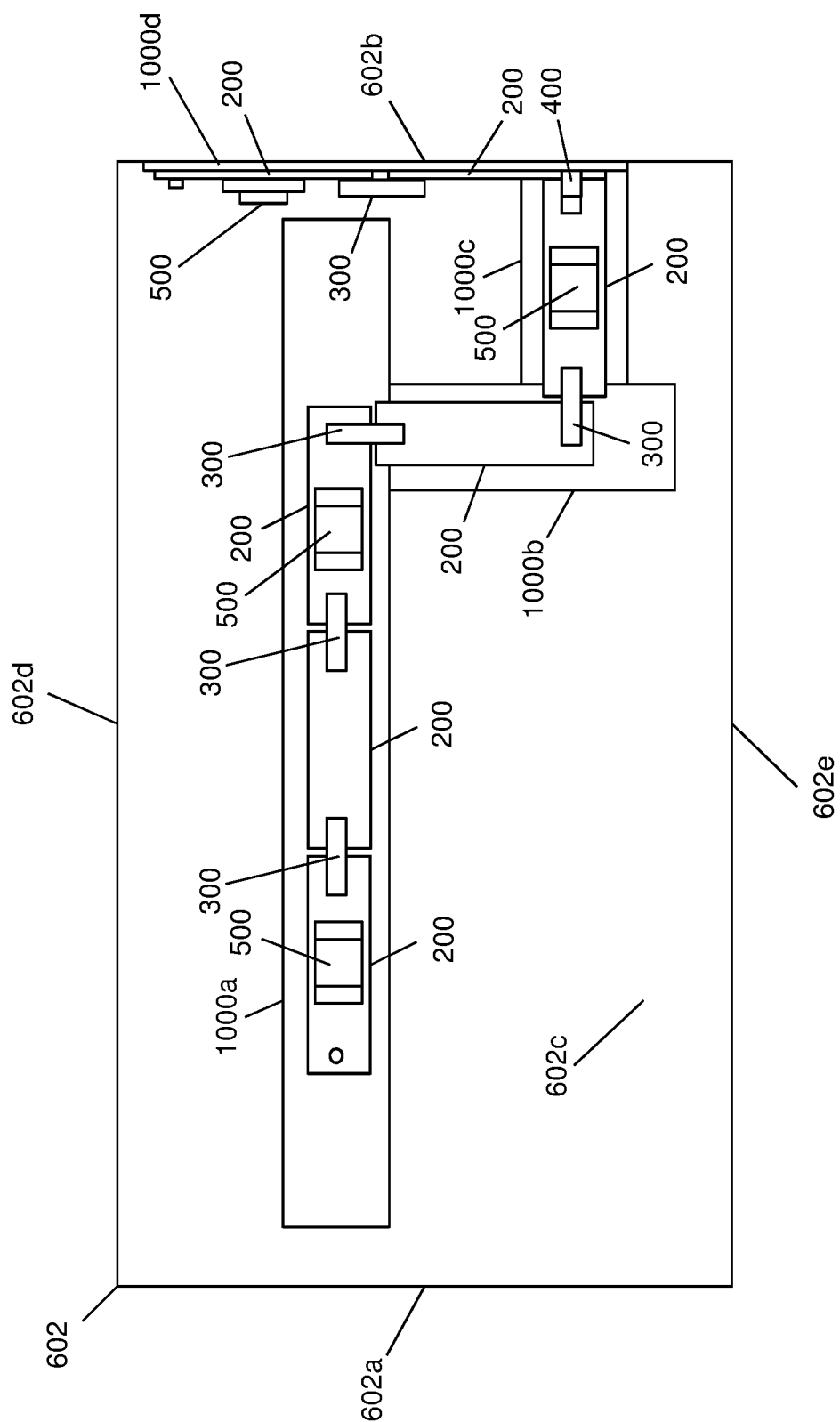
FIG. 13A is a schematic top view illustrating an embodiment of power transmission couplings of FIG. 5 provided in the chassis of FIG. 12A.
Figure 13B:
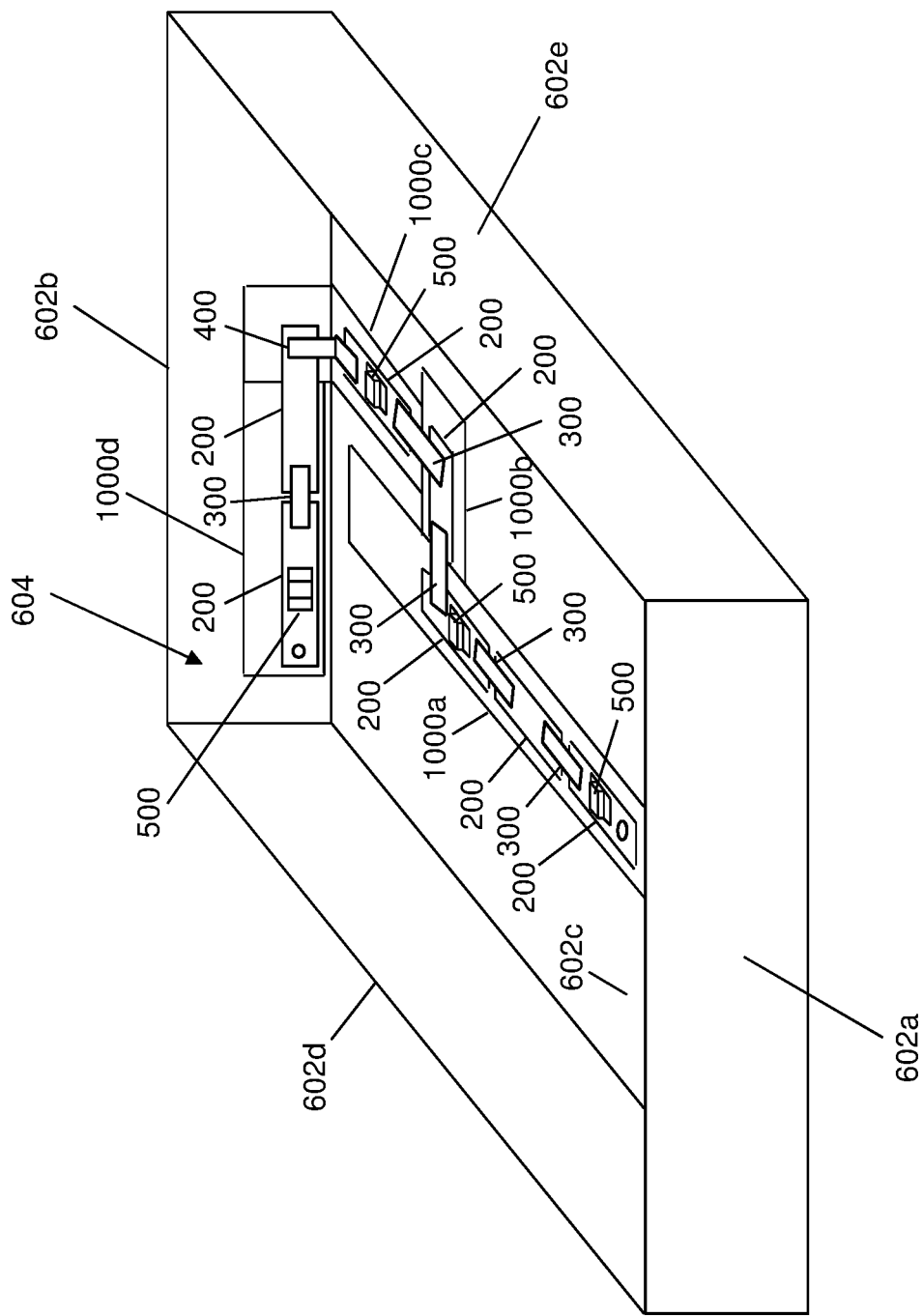
FIG. 13B is a schematic perspective view illustrating an embodiment of the power transmission couplings provided in the chassis of FIG. 13A.
Figure 13C:
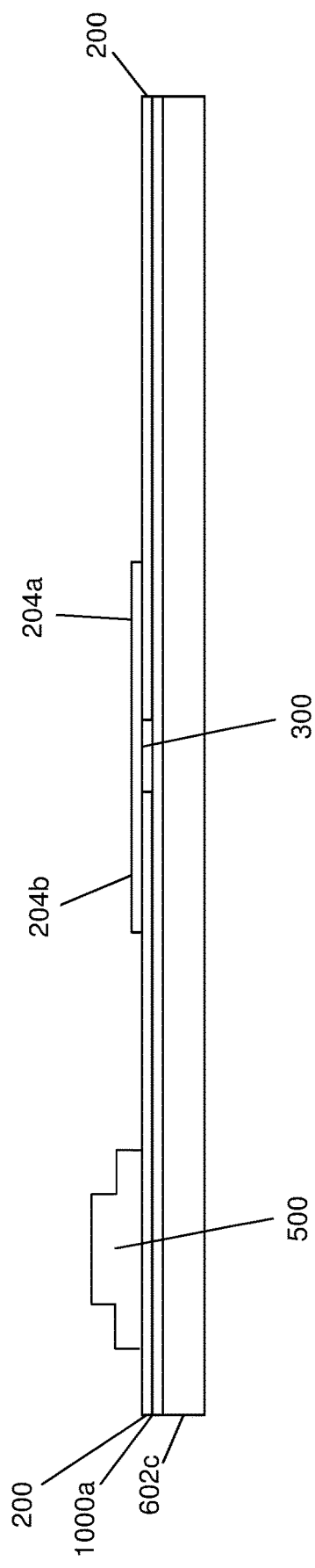
FIG. 13C is a schematic cross sectional view illustrating an embodiment of a power transmission coupling provided in the chassis of FIGS. 13A and 13B.

The method 900 then proceeds to block 908 where power transmission coupling(s) are provided on the planar power module(s). In an embodiment, at block 908, a plurality of planar transmission couplings 500 may be provided on the planar power modules 200 included in the chassis 600. As discussed above, prior to the method 900, the configurations and relative locations of components that will be provided in the chassis 600 may be determined, which allows a provider of the power delivery system of the present disclosure to determine how power will be routed through the chassis 600 according to the teachings of the present disclosure. As such, that power routing plan may be utilized to determine the positioning of the planar transmission couplings 500 on the planar power modules 200. For example, FIGS. 13A, 13B, and 13C illustrate planar transmission couplings 500 provided on two of the three planar power modules 200 provided on the insulating material 1000a, a planar transmission coupling 500 provided on the planar power module 200 provided on the insulating material 1000c, and a planar transmission coupling 500 provided on one of the planar power modules 200 provided on the insulating material 1000d, and one of skill in the art in possession of the present disclosure will appreciate how the routing illustrated in FIGS. 13A and 13B may be provided according to a power routing plan. In an embodiment, the planar transmission couplings 500 may include a conductive adhesive material on their bottom surfaces 502d in order to allow those planar transmission couplings 500 to be provided on the planar power modules 200, although other techniques for providing the planar transmission couplings 500 on the planar power modules 200 will fall within the scope of the present disclosure as well.

Figure 14A:
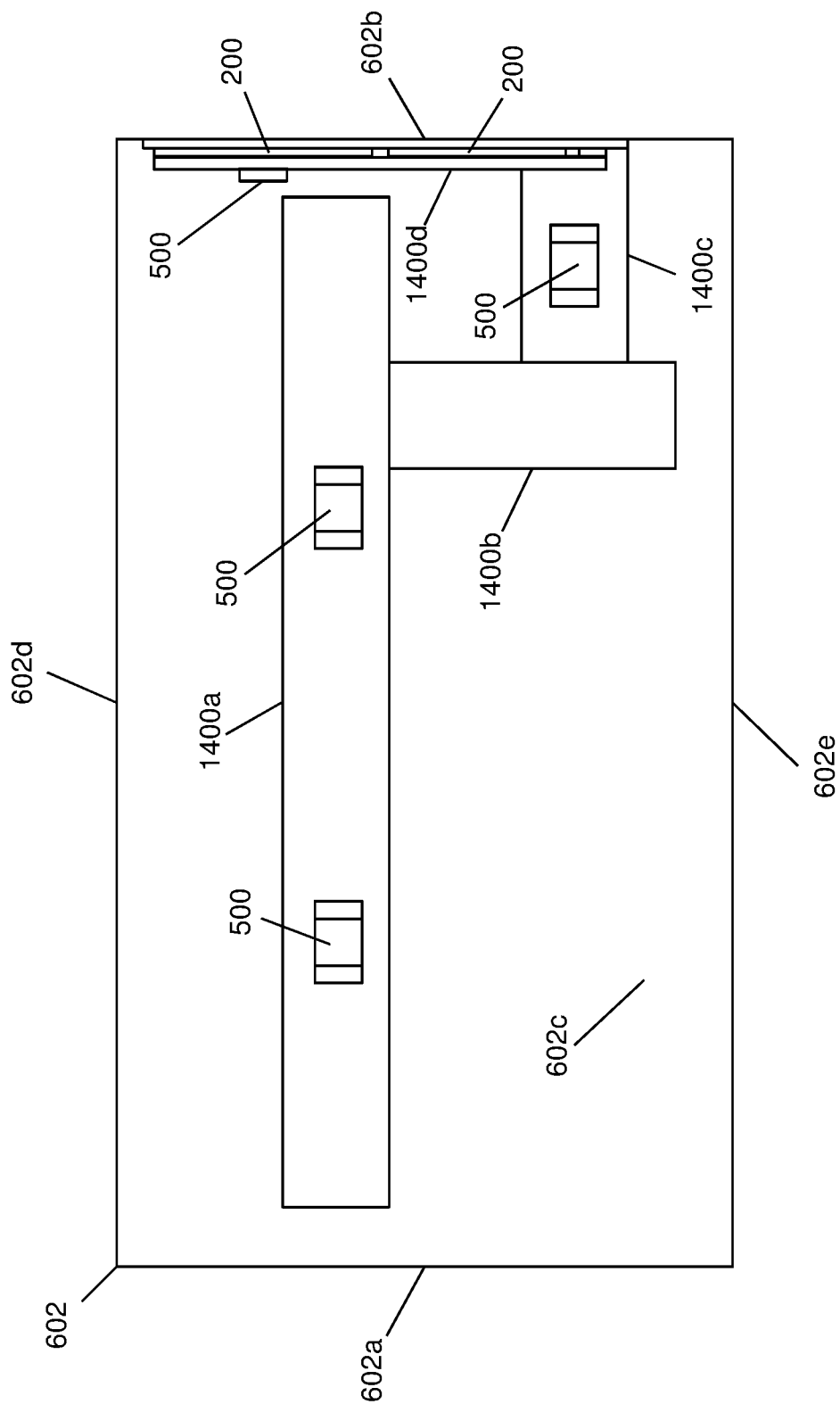
FIG. 14A is a schematic top view illustrating an embodiment of insulating layers provided in the chassis of FIG. 13A.
Figure 14B:
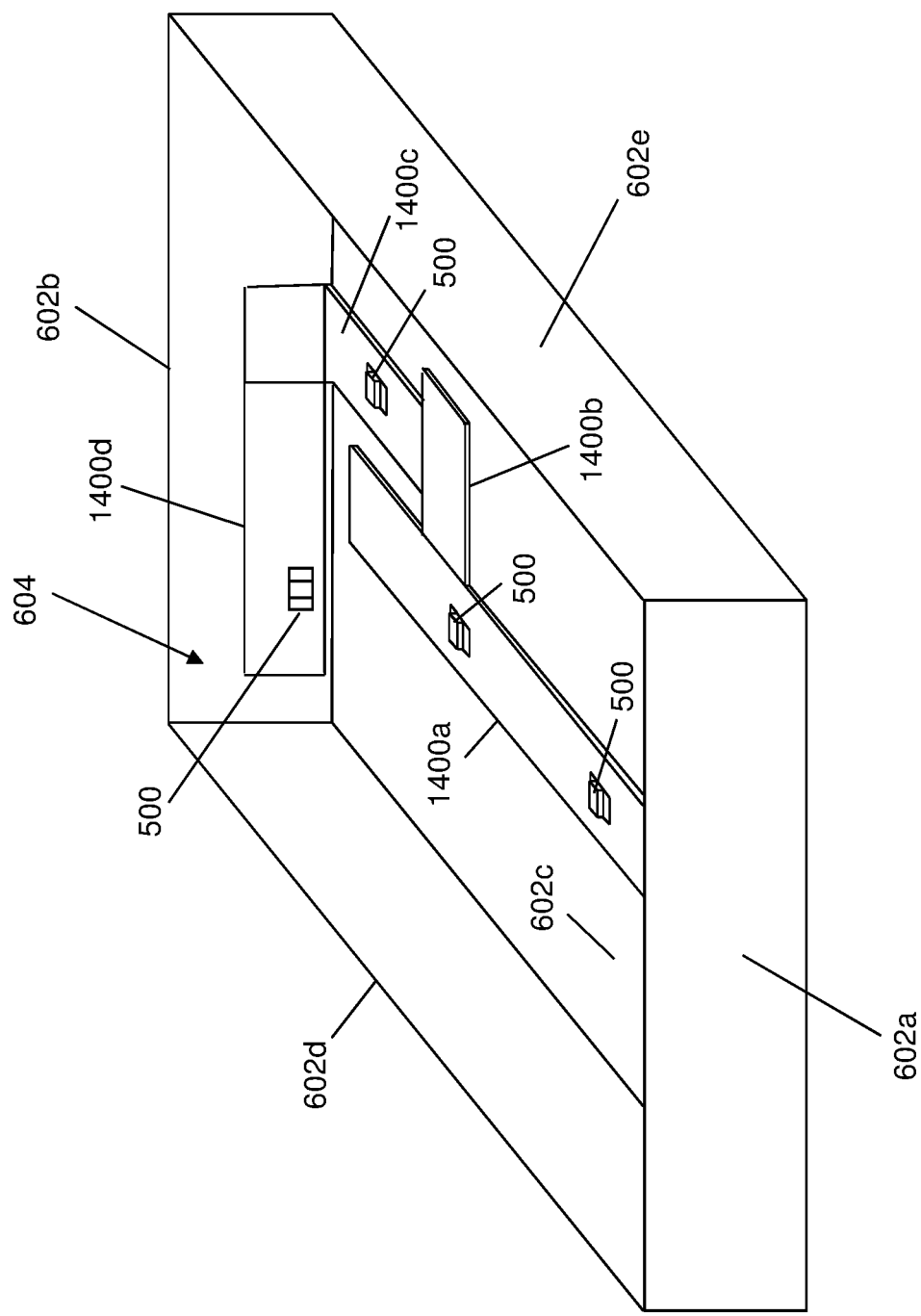
FIG. 14B is a schematic perspective view illustrating an embodiment of the insulating layers provided in the chassis of FIG. 14A.
Figure 14C:
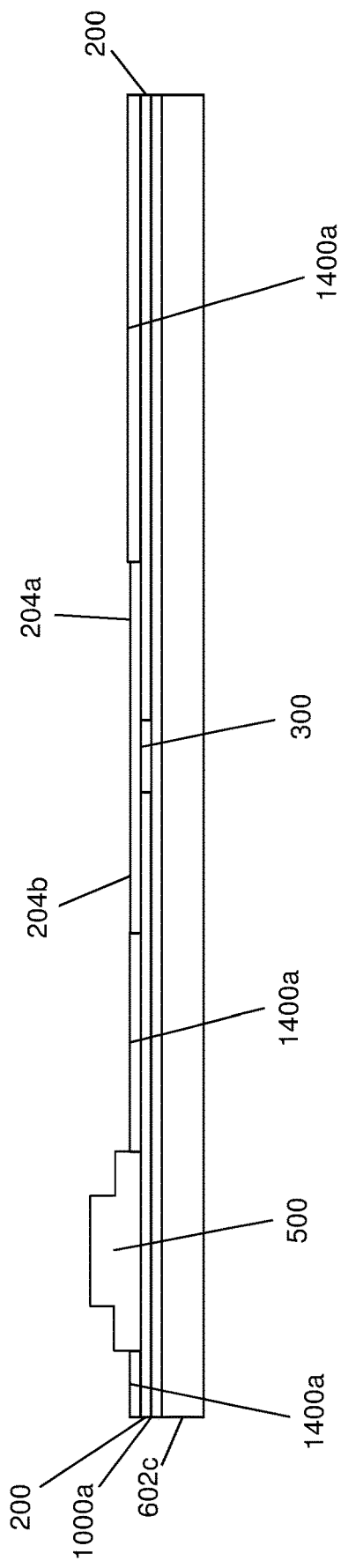
FIG. 14C is a schematic cross sectional view illustrating an embodiment of the insulating layers provided in the chassis of FIGS. 14A and 14B.

The method 900 then proceeds to block 910 where an insulating layer is provided on the planar power modules. In an embodiment, at block 910, an insulating material may be utilized to provide an insulating layer on the planar power modules 200 provided in the chassis 600. For example, FIGS. 14A, 14B, and 14C illustrate insulating material 1400a, 1400b, and 1400c provided on the planar power modules 200 on the bottom wall 602c of the chassis 600, and insulating material 1400d provided on planar power modules on the rear wall 602b of the chassis 600. One of skill in the art in possession of the present disclosure will appreciate how, in some embodiments, the planar power modules 200 and the planar power module connectors 300 and 400 may not be insulated, and thus the insulating material may be provided on those planar power modules and planar power module connectors in a manner that ensures the insulated transmission of power via those components. In an embodiment, the insulting material that provides the insulting layer may include an adhesive to provide that insulating material on the planar power modules 200 and the planar power module connectors 300 and 400. For example, an insulting tape may be used to provide the insulting layer at block 910, although one of skill in the art in possession of the present disclosure will appreciate that other materials and techniques for providing an insulting layer will fall within the scope of the present disclosure as well. Furthermore, as discussed above, in some embodiments the planar power modules 200 and the insulating material may be combined by, for example, providing an insulating material on the top surface 202c of the planar power module 200. Similarly, in some embodiments, the planar power module connectors 300 and 400 and the insulating material may be combined by, for example, providing an insulating material on the top surface 302c of the planar power module connector 300, and providing an insulating material on the top surface 402b and front surface 404b of the planar power module connector 400.

Figure 15A:
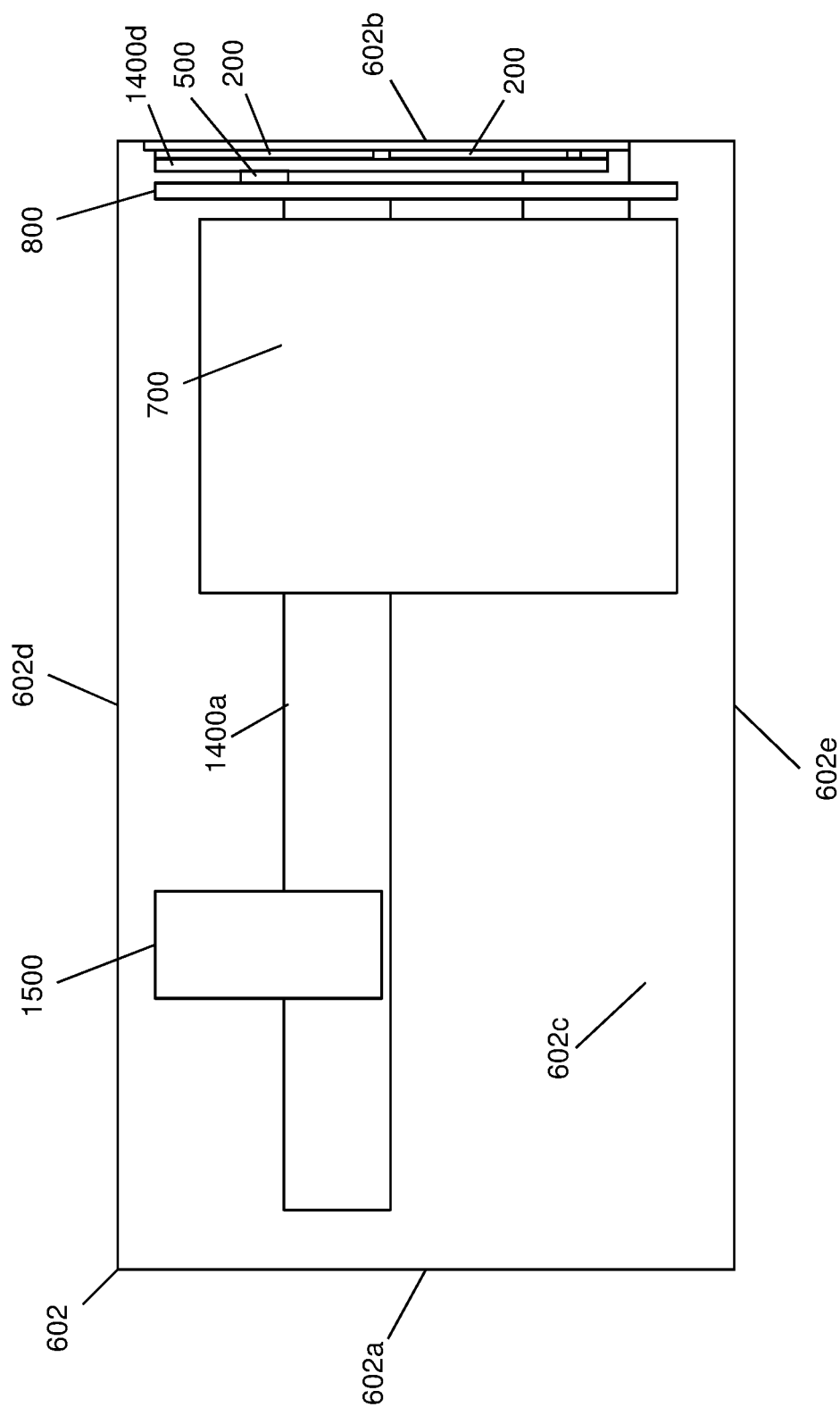
FIG. 15A is a schematic top view illustrating an embodiment of the circuit boards of FIGS. 7A, 7B, 8A, and 8B provided in the chassis of FIG. 14A.
Figure 15B:
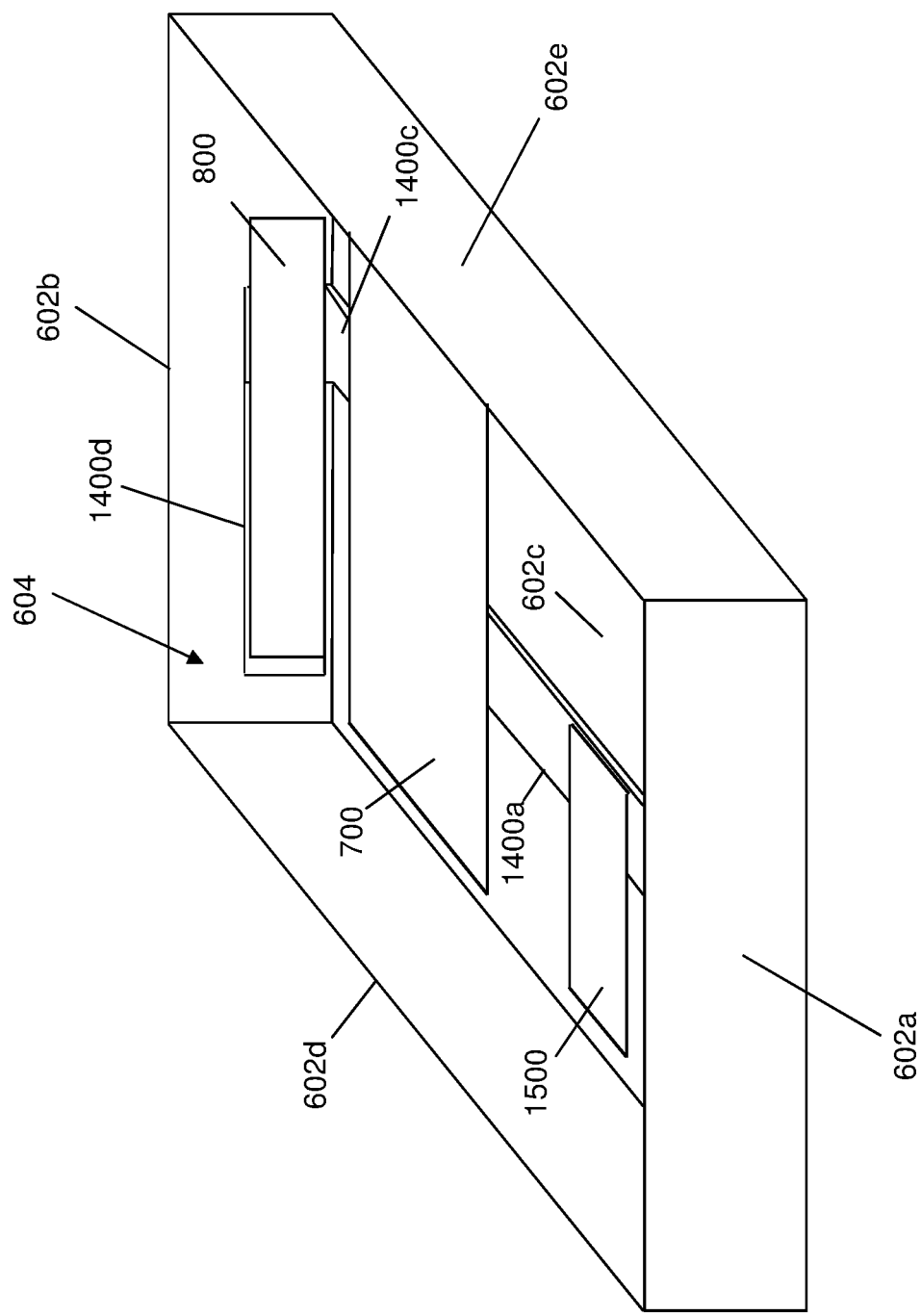
FIG. 15B is a schematic perspective view illustrating an embodiment of the circuit boards provided in the chassis of FIG. 15A.
Figure 15C:
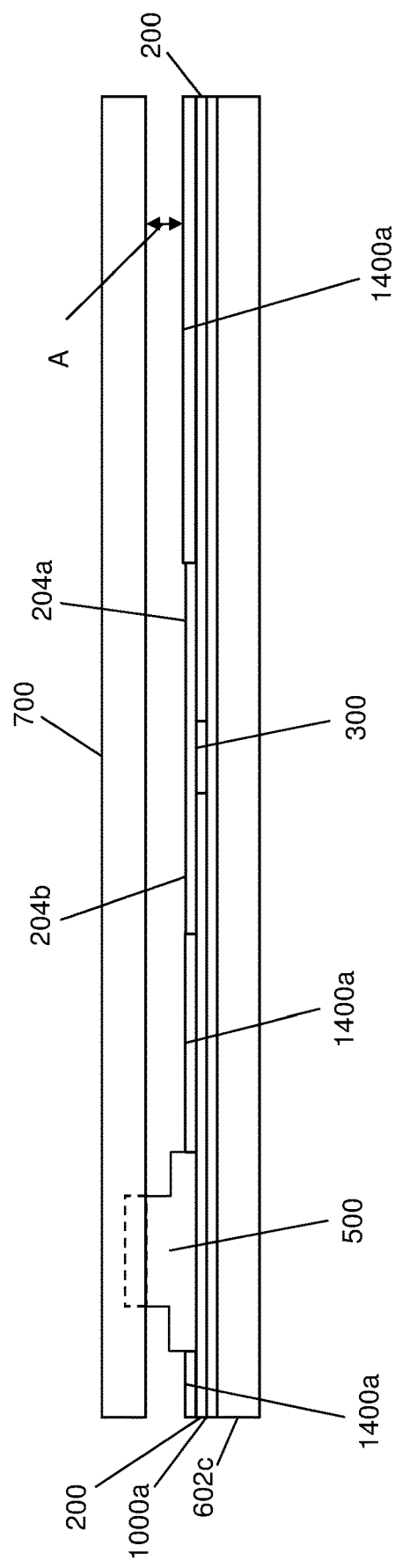
FIG. 15C is a schematic cross sectional view illustrating an embodiment of a circuit board provided in the chassis of FIG. 15A.

The method 900 then proceeds to block 912 where component(s) are coupled to the power transmission coupling(s). In an embodiment, at block 912, components may be coupled to the power transmission couplings 500 via a circuit board. For example, FIGS. 15A, 15B, and 15C illustrate the circuit board 700 positioned in the chassis housing 604 such that the power transmission pads 704a and 704b on the bottom surface 702d of the circuit board 700 engage respective power transmission couplings 500 provided on the planar power modules 200 adjacent the bottom wall 602c of the chassis 600, and the circuit board 800 positioned in the chassis housing 604 such that the power transmission pad 804 on the side surface 802e of the circuit board 800 engages the power transmission coupling 500 provided on the planar power modules 200 adjacent the rear wall 602b of the chassis 600. As such, a power delivery system is provided by planar power modules that may be located between the chassis inner surface of the chassis 600 and circuit boards 700 and 800 housed in that chassis 600.

In addition, FIGS. 15A, 15B, and 15C illustrate how a power source circuit board 1500 may be positioned in the chassis housing 604 such that a power transmission pad (not illustrated) on a bottom surface of the circuit board 1500 engages a power transmission coupling 500 provided on the planar power module 200 adjacent the bottom wall 602c of the chassis 600 in order to couple a power source (not illustrated) to the planar power modules 200 in the chassis 600. However, while the embodiment illustrated in FIGS. 15A and 15B provides for the coupling of a power source to the planar power modules 200 via the power transmission coupling 500 of the present disclosure, one of skill in the art in possession of the present disclosure will appreciate that a power source may be coupled to the planar power modules 200 via cabling or other techniques known in the art. Furthermore, while particular circuit boards are illustrated and described as coupling to the power delivery system of the present disclosure, other powered components (e.g., backplanes, devices, etc.) may couple to the power delivery system of the present disclosure while remaining within the scope of the present disclosure as well. Further still, while the Figures provided herein are not necessarily drawn to scale, FIG. 15C illustrates how the relatively thickness of the power delivery system components, the chassis 600, and the circuit board 700 may provide an air gap A between the circuit board 700 and the chassis 600/power delivery system components. As will be appreciated by one of skill in the art in possession of the present disclosure, the air gap A is illustrative of how the power delivery system may not substantially effect (or minimize its effects on) the airflow between the circuit board 700 and the chassis 600.

The method 900 then proceeds to block 914 where power is transmitted from a power system via the planar power modules and power transmission coupling(s) to the component(s). In an embodiment, at block 914, power from the power source may be transmitted from the power source to the planar power module(s) to which it is connected, via the planar power modules 200 and the planar power modules connecting them, and then to the power transmission couplings 500. The power transmission pads 704a, 704b, and 804 on the circuit boards 700 and 800 may then receive that power via those power transmission couplings 500 and provide that power to the components coupled to them. Thus, the power transmission pads may be directly connected to components mounted opposite them on the circuit boards as discussed above, and may power those components accordingly. Furthermore, the power transmission pads may be indirectly connected to components mounted to the circuit boards via cabling and/or other power components, and may power those components accordingly as well.

Figure 16A:
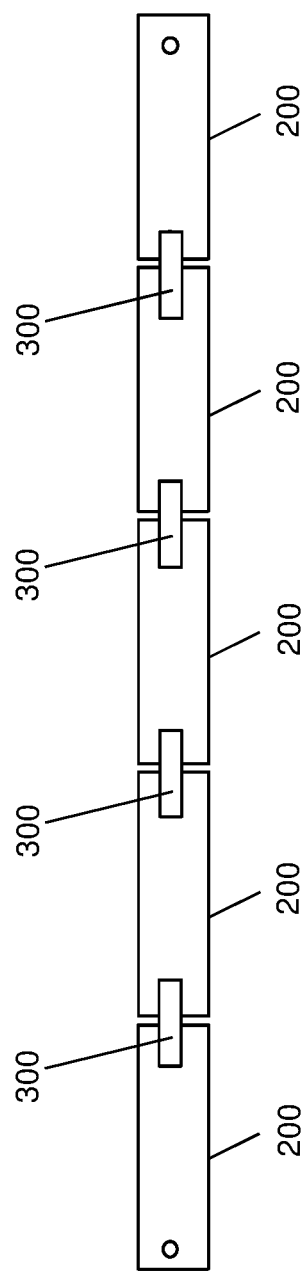
FIG. 16A is a schematic top view illustrating an embodiment of a "linear" power delivery topology provided according to the teachings of the present disclosure.
Figure 16B:
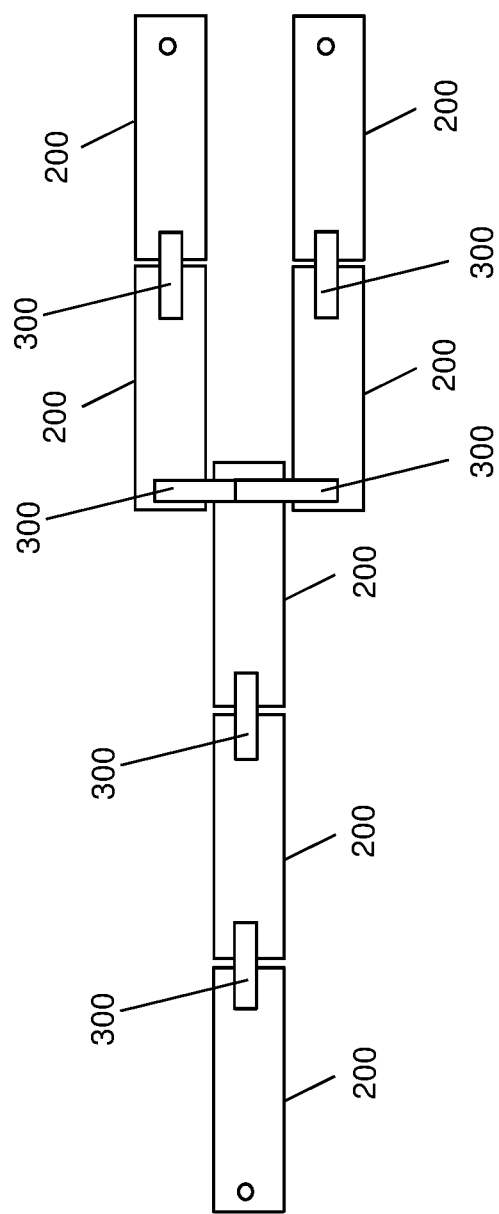
FIG. 16B is a schematic top view illustrating an embodiment of a "daisy chain" power delivery topology provided according to the teachings of the present disclosure.
Figure 16C:
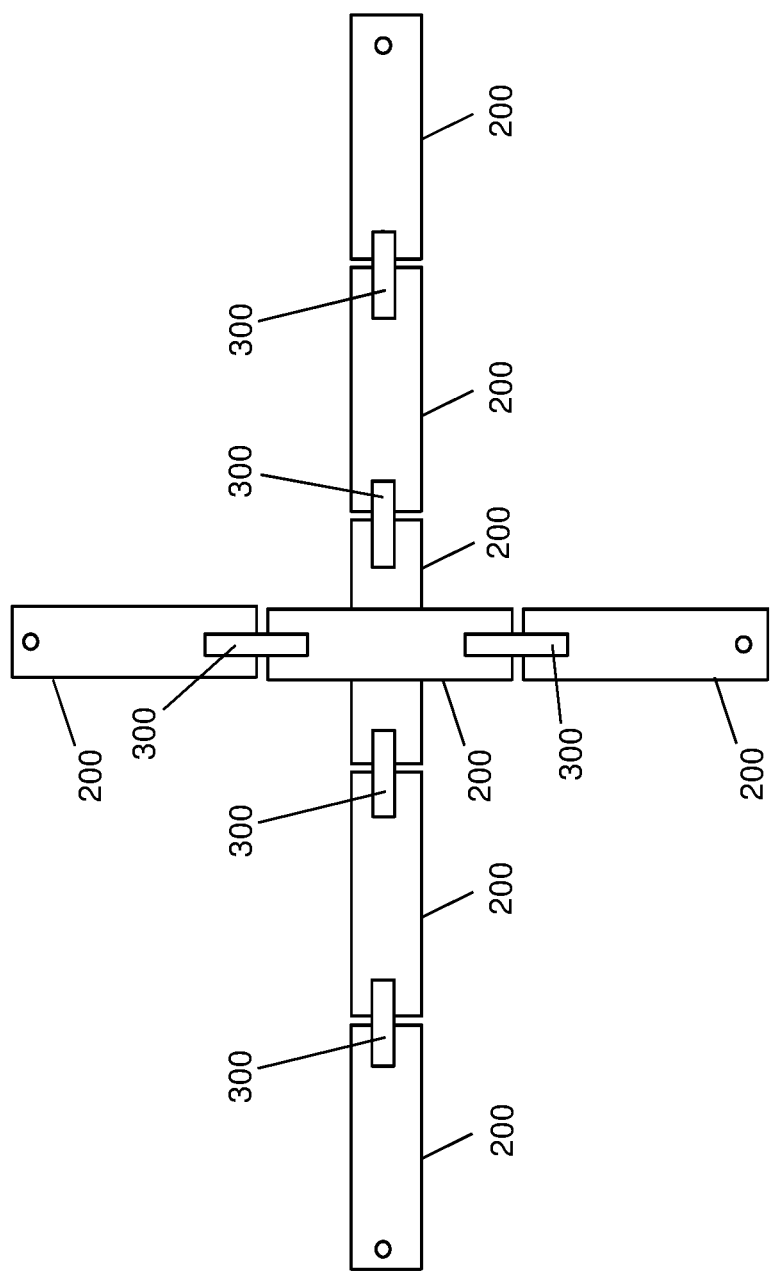
FIG. 16C is a schematic top view illustrating an embodiment of a "crossover" power delivery topology provided according to the teachings of the present disclosure.

Referring now to FIGS. 16A-16C, embodiments of different power delivery topologies are illustrated to provide examples of implementations of the power delivery system of the present disclosure. FIG. 16A illustrates an example of a "linear" power delivery topology provided according to the teachings of the present disclosure, and includes a plurality of the planar power modules 200 connected by power modules connectors 300 "in series", which one of skill in the art in possession of the present disclosure will appreciate may be utilized to deliver power from a power source to a component. Furthermore, FIG. 16B illustrates an example of a "daisy chain" power delivery topology provided according to the teachings of the present disclosure, and includes three of the planar power modules 200 connected by power modules connectors 300 "in series", with one of those planar power modules connected to both a first pair of power modules 200 by power module connectors 300, and a second pair of power modules 200 by power module connectors 300, and which one of skill in the art in possession of the present disclosure will appreciate may be utilized to deliver power from a power source to multiple components. As will be appreciated by one of skill in the art in possession of the present disclosure, the power delivery topology illustrated in FIG. 16B may include modified power module connectors 300 that connect the planar power module 200 to the first pair of power modules 200 and the second pair of power module connectors 300 via features (e.g., similar to the planar power module couplings 204a and 204b) and/or adapters that allow a single planar power module to connect to two or more planar power modules as illustrated in FIG. 16B.

Further still, FIG. 16C illustrates an example of a "crossover" power delivery topology provided according to the teachings of the present disclosure, and includes a first set of five of the planar power modules 200 connected by power modules connectors 300 "in series", and a second set of three of the planar power modules 200 connected by power modules connectors 300 "in series", which one of skill in the art in possession of the present disclosure will appreciate allows different power to be delivered by one or more power sources to different components (e.g., first power delivered by the first set of five planar power modules 200, and second power delivered by the second set of three planar power modules 200). As will be appreciated by one of skill in the art in possession of the present disclosure, an insulating layer similar to those described above may be provided between the overlapping planar power modules in the first set of five planar power modules 200 and the second set of three planar power modules 200. However, while a few specific example topologies have been illustrated, one of skill in the art in possession of the present disclosure will recognize that the teachings of the present disclosure allow a user of the power delivery system of the present disclosure to create a variety of power delivery topologies based on the needs of the computing system for which power is being delivered.

Thus, systems and methods have been described that provide for the delivery of power in an information handling system via planar power modules located between a chassis wall and a circuit board. For example, an insulating layer may be provided on one or more chassis inner surfaces provided by one or more chassis walls, and a plurality of the planar power modules may be provided on the insulting layer and connected together via planar power module connectors. One or more power transmission couplings may then be provided on the planar power modules, with the configuration of the planar power modules and the power transmission couplings provided according to circuit boards and/or components that are to-be provided power in the chassis. An insulating layer may then be provided over the planar power modules and planar power module connectors, and the planar power modules may then be coupled to a power source (e.g., via one of the power transmission couplings). One or more circuit boards may then be provided in the chassis such that power transmission pads on the circuit boards that are coupled to components on the circuit board engage respective power transmission couplings. Power may then be provided from the power source, through the planar power modules and planar power module connectors, and via the power transmission couplings and power transmission pads to the components on the circuit board.

As such, a power delivery system is provided that includes a variety of benefits over conventional power delivery systems. For example, the power delivery system of the present disclosure provides for adaptable designs that allow a designer to utilize the planar power modules as building blocks to design different power delivery configurations for different computing systems. Furthermore, the positioning of the planar power modules between the chassis walls and the circuit boards does not influence high speed and/or other sensitive signal routing and/or signaling in the circuit board, while also allowing thinner and less expensive circuit board designs. Further still, failures such as short circuits in the power delivery system of the present disclosure will not impact the circuit board, preventing circuit board and component damage in the event of such failures. The power delivery system of the present disclosure also provides for easy updating, modification, and maintenance, while allowing for separate and optional power delivery routing (e.g., for different power rails). Finally, the power delivery system of the present disclosure saves volume in the chassis, does not impact component placement and circuit board design, and does not substantially affect chassis housing airflow.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A power delivery system, comprising:
   a first planar power module that is coupled to a power system and that is configured to transmit power received from the power system;
   a first planar power module connector that is connected to the first planar power module and that is configured to transmit the power received from the first planar power module;
   a second planar power module that is connected to the first planar power module connector and that is configured to transmit the power received from the first planar power module connector; and
   a first power transmission coupling engaging at least one of the first planar power module and the second planar power module, wherein the first power transmission coupling is configured to receive the power from the at least one of the first planar power module and the second planar power module to which the first power transmission coupling is engaged, and transmit the power to a first component via a first power transmission pad that is coupled to the first component and that engages the first power transmission coupling.

2. The system of claim 1, further comprising:
   a second planar power module connector that is connected to the second planar power module and that is configured to transmit the power received from the second planar power module; and
   a third planar power module that is connected to the second planar power module connector and that is configured to transmit the power received from the second planar power module connector.

3. The system of claim 2, further comprising:
   a second power transmission coupling engaging the third planar power module, wherein the second power transmission coupling is configured to receive the power from the third planar power module, and transmit the power to a second component via a second power transmission pad that is coupled to the second component and that engages the second power transmission coupling.

4. The system of claim 1, further comprising:
   an insulating layer engaging the first planar power module and the second planar power module.

5. The system of claim 1, wherein the first power transmission coupling includes a conductive rubber material.

6. The system of claim 1, wherein the first component is a circuit board.

7. An Information Handling System (IHS), comprising:
   a chassis including a chassis inner surface;
   a circuit board that is included in the chassis and that includes a first transmission pad that is coupled to a first component on the circuit board;
   a first planar power module that is located between the chassis inner surface and the circuit board, coupled to a power system, and configured to transmit power received from the power system;
   a first planar power module connector that is located between the chassis inner surface and the circuit board, connected to the first planar power module, and configured to transmit the power received from the first planar power module;
   a second planar power module that is located between the chassis inner surface and the circuit board, connected to the first planar power module connector, and configured to transmit the power received from the first planar power module connector; and
   a first power transmission coupling engaging the first transmission pad included on the circuit board and at least one of the first planar power module and the second planar power module, wherein the first power transmission coupling is configured to receive the power from the at least one of the first planar power module and the second planar power module to which the first power transmission coupling is engaged, and transmit the power via the first transmission pad to the first component on the circuit board.

8. The IHS of claim 7, further comprising:
   a second planar power module connector that is located between the chassis inner surface and the circuit board, connected to the second planar power module, and configured to transmit the power received from the second planar power module; and a third planar power module that is located between the chassis inner surface and the circuit board, connected to the second planar power module connector, and configured to transmit the power received from the second planar power module connector.

9. The IHS of claim 8, wherein the circuit board includes a second transmission pad that is coupled to a second component on the circuit board, and further comprising:

a second power transmission coupling engaging the second transmission pad included on the circuit board and the third planar power module, wherein the second power transmission coupling is configured to receive the power from the third planar power module and transmit the power via the second transmission pad to the second component on the circuit board.

10. The IHS of claim 7, further comprising:
an insulating layer engaging the chassis inner surface and each of the first planar power module and the second planar power module.

11. The IHS of claim 7, wherein the first power transmission coupling includes a conductive rubber material.

12. The IHS of claim 7, further comprising:
an insulating layer located between the circuit board and each of the first planar power module and the second planar power module.

13. The IHS of claim 7, wherein the circuit board is free of a power layer.

14. A method for delivering power, comprising:
transmitting, by a first planar power module that is located between a chassis inner surface of a chassis and a circuit board that is housed in the chassis, power received from the power system;
transmitting, by a first planar power module connector that is located between the chassis inner surface and the circuit board and that is connected to the first planar power module, the power received from the first planar power module;
transmitting, by a second planar power module that is located between the chassis inner surface and the circuit board and that is connected to the first planar power module connector, the power received from the first planar power module connector;
receiving, by a first power transmission coupling engaging at least one of the first planar power module and the second planar power module, the power from the at least one of the first planar power module and the second planar power module to which the first power transmission coupling is engaged; and
transmitting, by the first power transmission coupling, the power to a first component via a first power transmission pad that is coupled to the first component and that engages the first power transmission coupling.

15. The method of claim 14, further comprising:
transmitting, by a second planar power module connector that is located between the chassis inner surface and the circuit board and that is connected to the second planar power module, the power received from the second planar power module; and
transmitting, by a third planar power module that is located between the chassis inner surface and the circuit board and that is connected to the second planar power module connector, the power received from the second planar power module connector.

16. The method of claim 14, further comprising:
receiving, by a second power transmission coupling engaging the third planar power module, the power from the third planar power module; and
transmitting, by the second power transmission coupling, the power to a second component via a second power transmission pad that is coupled to the second component and that engages the second power transmission coupling.

17. The method of claim 14, further comprising:
insulating, by an insulating layer engaging the chassis inner surface and each of the first planar power module and the second planar power module, the first planar power module and the second planar power module from the chassis.

18. The method of claim 14, wherein the first power transmission coupling includes a conductive rubber material.

19. The method of claim 14, further comprising:
insulating, by an insulating layer located between the circuit board and each of the first planar power module and the second planar power module, the first planar power module and the second planar power module from the circuit board.

20. The method of claim 14, further comprising:
wherein the circuit board is free of a power layer.

* * * * *